(12) United States Patent
Hur et al.

(10) Patent No.: US 12,094,803 B2
(45) Date of Patent: Sep. 17, 2024

(54) SOLID STATE DRIVE APPARATUS AND DATA STORAGE APPARATUS INCLUDING THE SAME

(71) Applicant: SAMSUNG ELECTRONICS CO., LTD., Suwon-si (KR)

(72) Inventors: Sungchul Hur, Suwon-si (KR); Duksoo Kim, Suwon-si (KR); Hu Zhao, Suwon-si (KR); Bumjun Kim, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 136 days.

(21) Appl. No.: 17/454,119

(22) Filed: Nov. 9, 2021

(65) Prior Publication Data
US 2022/0344243 A1   Oct. 27, 2022

(30) Foreign Application Priority Data
Apr. 21, 2021   (KR) .................. 10-2021-0051830

(51) Int. Cl.
*H01L 23/00* (2006.01)
*H01L 23/467* (2006.01)
(Continued)

(52) U.S. Cl.
CPC ........ *H01L 23/467* (2013.01); *H01L 25/0652* (2013.01); *H01L 25/18* (2013.01);
(Continued)

(58) Field of Classification Search
CPC ... H01L 23/467; H01L 25/0652; H01L 25/18; H05K 1/144; H05K 1/148; H05K 1/18;
(Continued)

(56) References Cited

U.S. PATENT DOCUMENTS 5,218,516 A * 6/1993 Collins .............. H05K 7/20545
361/721
7,960,666 B2   6/2011 Han et al.
(Continued)

FOREIGN PATENT DOCUMENTS

CN      207781198 U  *  8/2018 ............. G11B 33/04
JP      2019022293       2/2019
(Continued)

OTHER PUBLICATIONS

Korean Notice of Allowance Dated Apr. 22, 2022 For Application Serial No. 10-2021-0051830.
(Continued)

*Primary Examiner* — Zhengfu J Feng
(74) *Attorney, Agent, or Firm* — F. Chau & Associates, LLC

(57) ABSTRACT

A solid state drive apparatus includes a casing including a top plate, a bottom plate, a first sidewall, and a second sidewall. A first substrate is disposed inside the casing. At least one first semiconductor chip is mounted on the first substrate. A second substrate is disposed inside the casing. At least one second semiconductor chip is mounted on the second substrate. A heat dissipation structure is disposed between the first substrate and the second substrate and includes a lower heat dissipation panel contacting the at least one first semiconductor chip. An upper heat dissipation panel contacts the at least one second semiconductor chip. An air passage is provided between the lower heat dissipation panel and the upper heat dissipation panel and extends from the first sidewall of the casing to the second sidewall.

20 Claims, 17 Drawing Sheets

(51) Int. Cl.
  *H01L 25/065* (2023.01)
  *H01L 25/18* (2023.01)
  *H05K 1/14* (2006.01)
  *H05K 7/20* (2006.01)
  *H05K 1/18* (2006.01)
  *H05K 5/00* (2006.01)

(52) U.S. Cl.
  CPC ......... *H05K 1/144* (2013.01); *H05K 7/20163* (2013.01); *H05K 7/20736* (2013.01); *H05K 1/148* (2013.01); *H05K 1/18* (2013.01); *H05K 5/0047* (2013.01); *H05K 5/0069* (2013.01); *H05K 2201/10159* (2013.01)

(58) Field of Classification Search
  CPC ........... H05K 7/20163; H05K 7/20736; H05K 5/0047; H05K 5/0069; H05K 2201/10159
  USPC ..................................................... 361/679.32
  See application file for complete search history.

(56) References Cited

U.S. PATENT DOCUMENTS

| | | | |
|---|---|---|---|
| 8,345,427 B2 | 1/2013 | Pauley et al. | |
| 9,158,349 B2 | 10/2015 | Berk et al. | |
| 9,648,730 B2 | 5/2017 | Harvilchuck | |
| 9,764,857 B2 | 9/2017 | Tracy et al. | |
| 9,898,056 B2 | 2/2018 | Dean et al. | |
| 10,085,364 B2 | 9/2018 | Voss | |
| 10,798,839 B2 | 10/2020 | Gao et al. | |
| 2004/0218367 A1* | 11/2004 | Lin | H05K 7/20509 361/720 |
| 2009/0016022 A1 | 1/2009 | Han et al. | |
| 2010/0091447 A1 | 4/2010 | Jaggers et al. | |
| 2018/0049349 A1* | 2/2018 | Voss | H05K 7/20436 |
| 2018/0352679 A1* | 12/2018 | Monson | G11B 33/142 |
| 2021/0015006 A1 | 1/2021 | Muto | |
| 2021/0092871 A1 | 3/2021 | Hur et al. | |
| 2021/0120672 A1* | 4/2021 | Hung | G06F 1/20 |

FOREIGN PATENT DOCUMENTS

| | | |
|---|---|---|
| KR | 10-2004-008150 | 9/2004 |
| KR | 10-0778023 | 11/2007 |
| KR | 10-2021-00344 | 3/2021 |

OTHER PUBLICATIONS

Extended European Search Report for Application Serial No. 22153594.1 Dated Jul. 13. 2022.

* cited by examiner

SOLID STATE DRIVE APPARATUS AND DATA STORAGE APPARATUS INCLUDING THE SAME

CROSS-REFERENCE TO RELATED APPLICATION

This application claims priority under 35 U.S.C. § 119 to Korean Patent Application No. 10-2021-0051830, filed on Apr. 21, 2021, in the Korean Intellectual Property Office, the disclosure of which is incorporated by reference herein in its entirety.

TECHNICAL FIELD

The present disclosure relates to a drive apparatus and, more particularly, to a solid state drive apparatus and a data storage apparatus including the same.

DISCUSSION OF THE RELATED ART

As the performance demanded of electronic devices rapidly increases, heat generated during operation of the electronic devices also increases. The performance of such devices may be throttled down when excessive heat is generated. To prevent degradation of the performance of an electronic device due to heat generated therein, excessive heat may be dissipated to the outside by attaching a heat spreader to elements of the electronic device that are prone to overheating, such as microprocessors. Such heat spreaders may include a material with excellent heat conduction.

SUMMARY

A solid state drive apparatus includes a casing including a top plate, a bottom plate, a first sidewall, and a second sidewall. A first substrate is disposed inside the casing. At least one first semiconductor chip is mounted on the first substrate. A second substrate is disposed inside the casing. At least one second semiconductor chip is mounted on the second substrate. A heat dissipation structure is disposed between the first substrate and the second substrate and includes a lower heat dissipation panel contacting the at least one first semiconductor chip. An upper heat dissipation panel contacts the at least one semiconductor chip. An air passage is provided between the lower heat dissipation panel and the upper heat dissipation panel and extends from the first sidewall of the casing to the second sidewall.

A solid state drive apparatus includes a casing including a top plate, a bottom plate, a first sidewall, and a second sidewall. A first substrate is disposed inside the casing. At least one first semiconductor chip is mounted on the first substrate. A second substrate is disposed inside the casing. At least one second semiconductor chip is mounted on the second substrate. A heat dissipation structure is disposed between the first substrate and the second substrate and includes a first end portion exposed through the first sidewall of the casing. A second end portion is exposed through the second sidewall of the casing. An air passage extends from the first end portion to the second end portion. The air passage is isolated from a space between outer surfaces of the heat dissipation structure and the casing.

A data storage apparatus includes a rack including a socket. A solid state drive apparatus is mounted on the rack. A cooling fan is disposed adjacent to the rack and is configured to force an air flow. The solid state drive apparatus includes a casing including a top plate, a bottom plate, a first sidewall, and a second sidewall. A first substrate is disposed inside the casing. An external connector is connected to the first substrate and inserted into the socket. At least one first semiconductor chip is mounted on the first substrate. A second substrate is disposed inside the casing. At least one second semiconductor chip is mounted on the second substrate. A heat dissipation structure includes a lower heat dissipation panel contacting the at least one first semiconductor chip. An upper heat dissipation panel contacts the at least one second semiconductor chip. An air passage is provided between the lower heat dissipation panel and the upper heat dissipation panel and extends from the first sidewall of the casing to the second sidewall.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
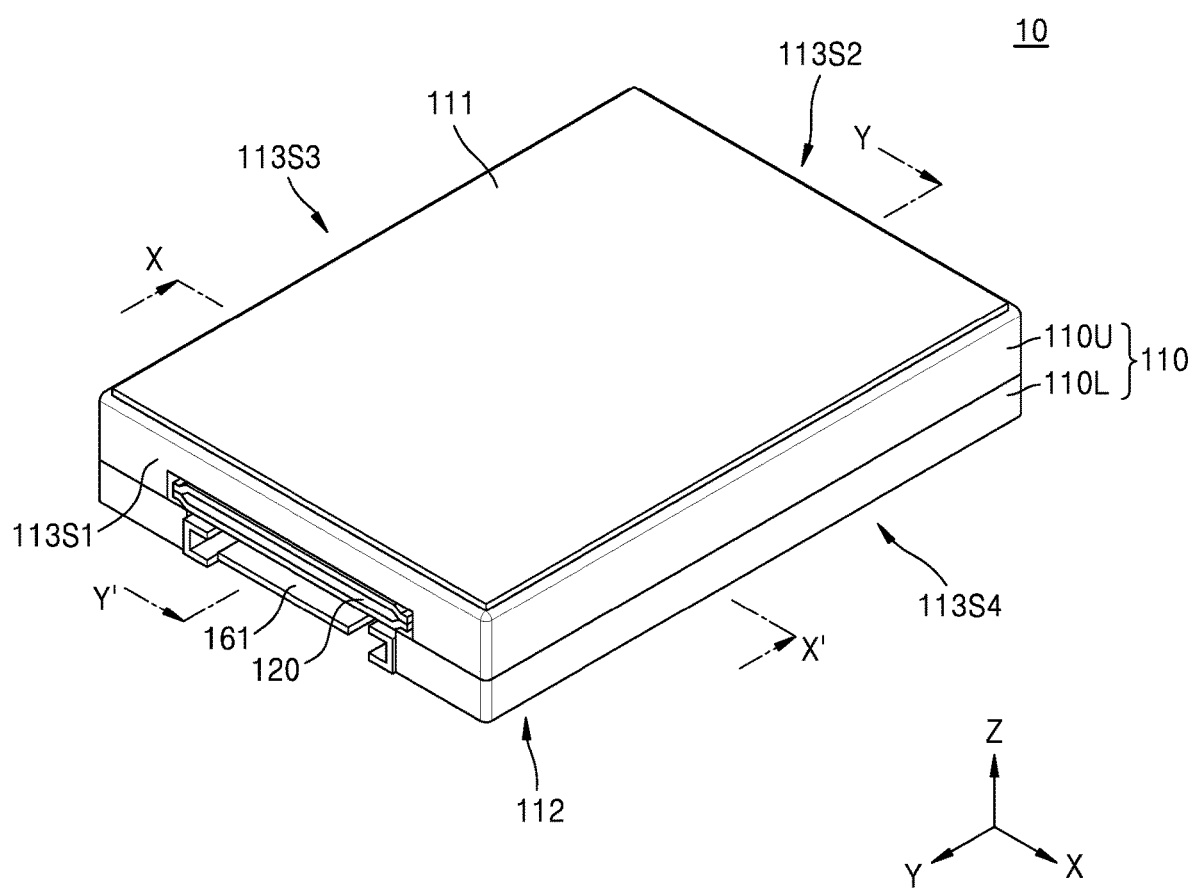
FIG. 1 is a perspective view of a solid state drive apparatus according to example embodiments of the inventive concept.

In describing embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Figure 2:
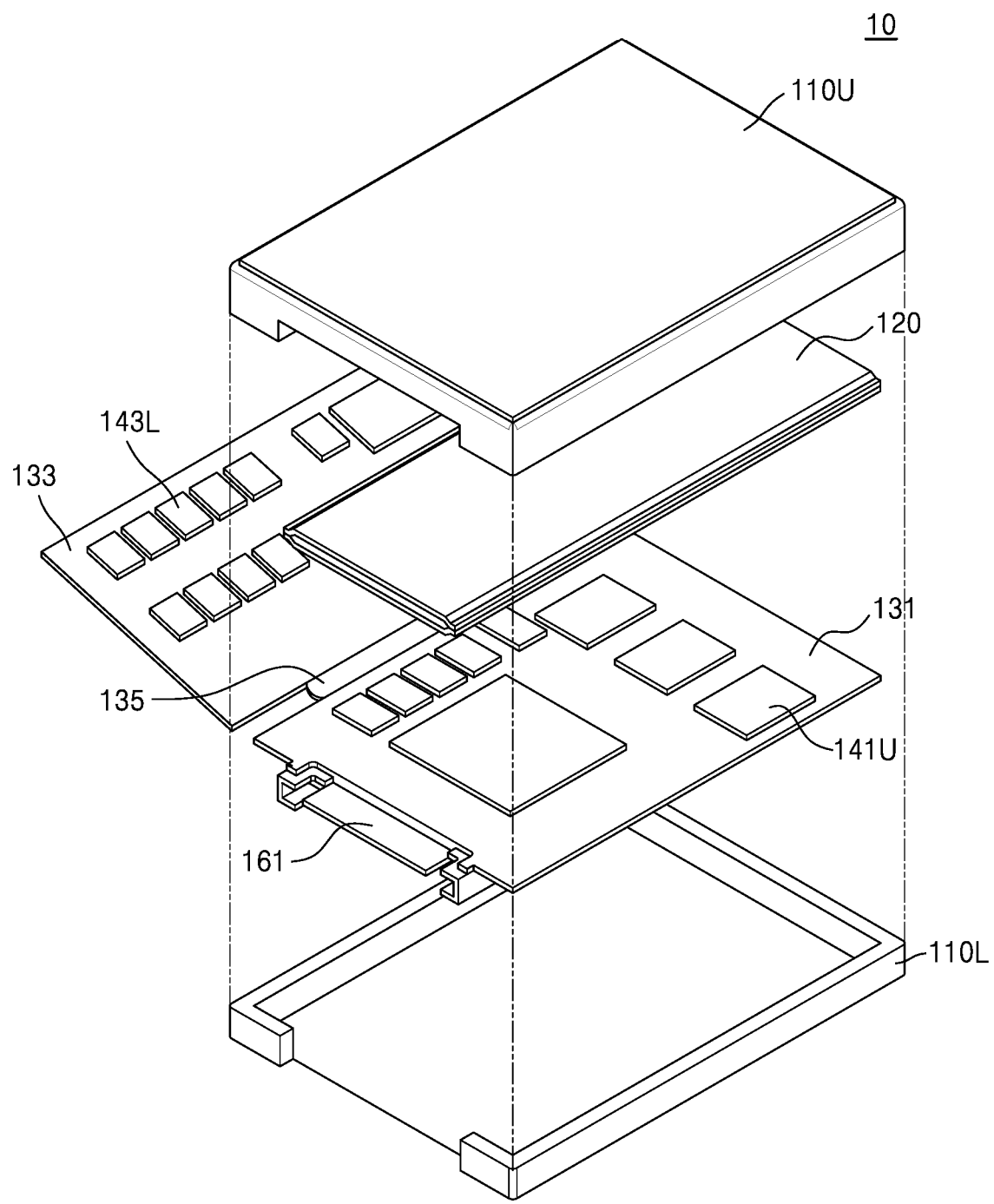
FIG. 2 is an exploded perspective view of the solid state drive apparatus of FIG. 1.
Figure 3:
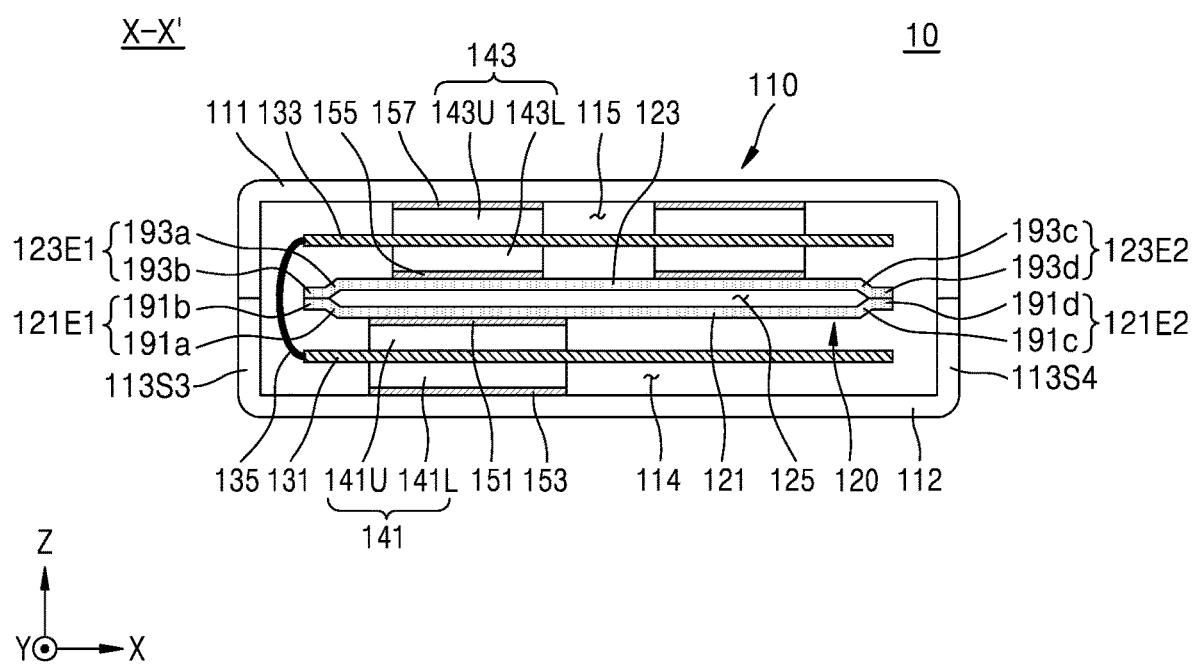
FIG. 3 is a cross-sectional view of the solid state drive apparatus along a line X-X' of FIG. 1.
Figure 4:
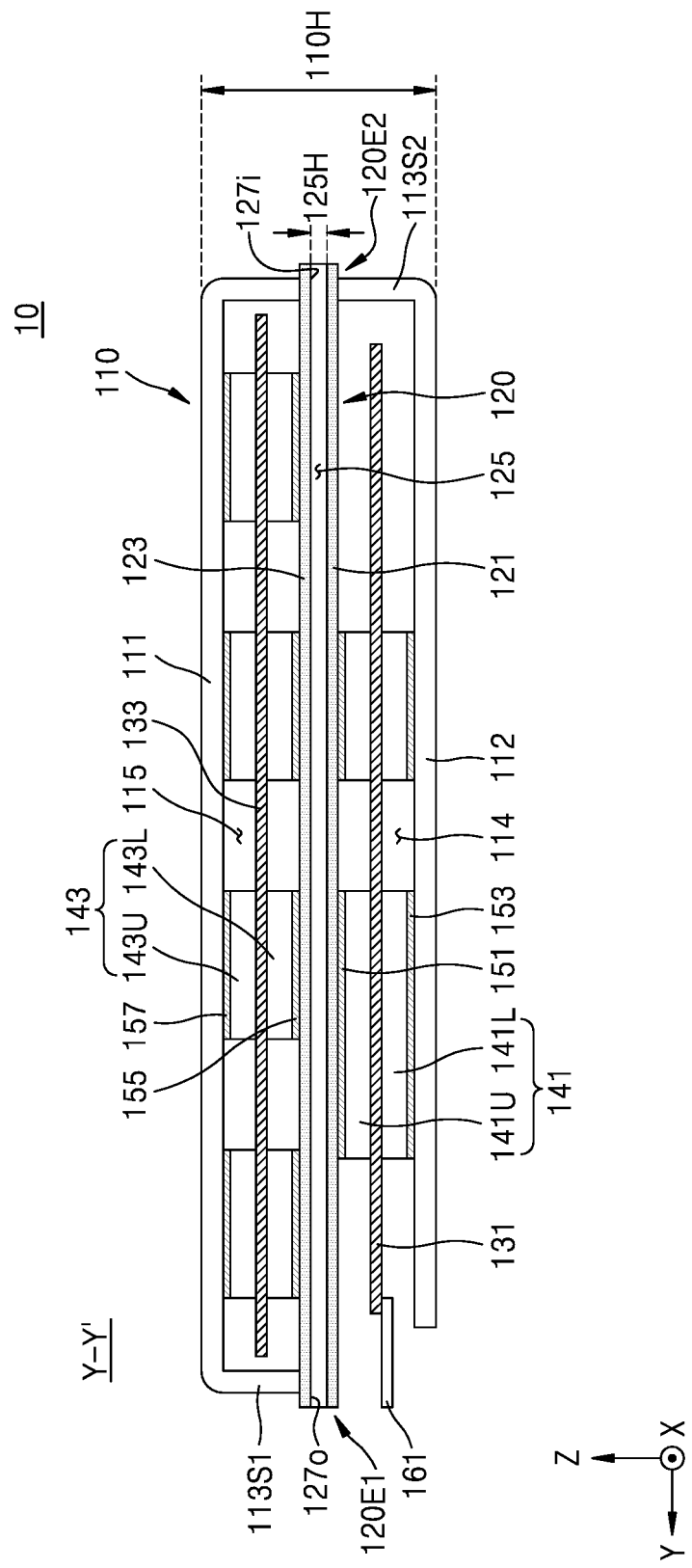
FIG. 4 is a cross-sectional view of the solid state drive apparatus along a line Y-Y' of FIG. 1.
Figure 5:
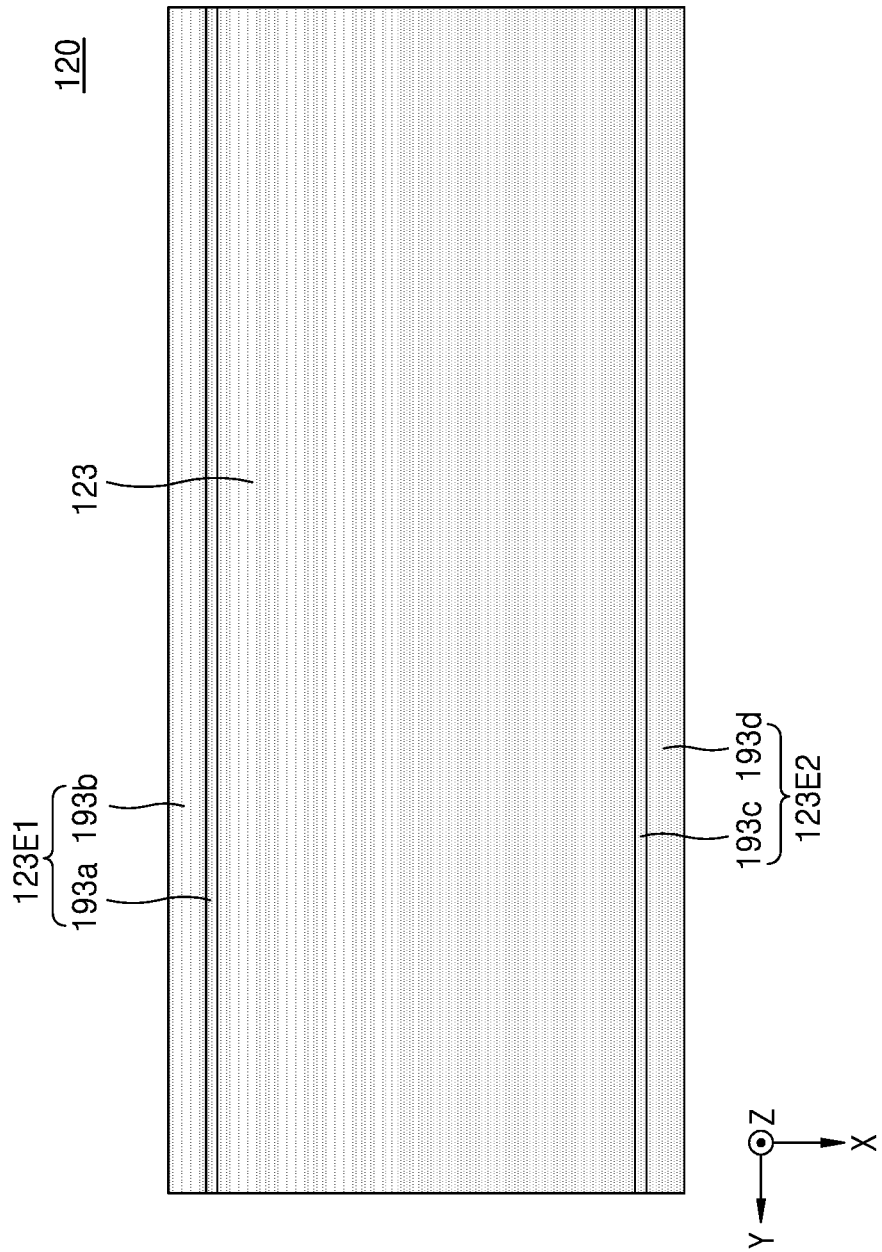
FIG. 5 is a plan view of a heat dissipation structure of the solid state drive apparatus of FIG. 1.

FIG. 1 is a perspective view of a solid state drive apparatus 10 according to example embodiments of the inventive concept. FIG. 2 is an exploded perspective view of the solid state drive apparatus 10 of FIG. 1. FIG. 3 is a cross-sectional view of the solid state drive apparatus 10 along a line X-X' of FIG. 1. FIG. 4 is a cross-sectional view of the solid state drive apparatus 10 along a line Y-Y' of FIG. 1. FIG. 5 is a plan view of a heat dissipation structure 120 of the solid state drive apparatus 10 of FIG. 1.

Referring to FIGS. 1 to 5, the solid state drive apparatus 10 may include a casing 110, the heat dissipation structure 120, a first substrate 131, at least one first semiconductor chip 141, a second substrate 133, at least one second semiconductor chip 143, and an external connector 161.

The casing 110 may form the exterior of the solid state drive apparatus 10. The casing 110 may have a 3-dimensional shape including an accommodation space (e.g., a cavity) in which various parts are accommodated. For example, the casing 110 may include a top plate 111 having a flat panel-like shape, a bottom plate 112 having a flat panel-like shape, and sidewalls extending between the top plate 111 and the bottom plate 112. In example embodiments, the casing 110 may have a cuboidal shape. The top plate 111 and the bottom plate 112 of the casing 110 may face each other, a first sidewall 113S1 and a second sidewall 113S2 of the casing 110 may face each other, and a third sidewall 113S3 and a fourth sidewall 113S4 of the casing 110 may face each other. The third sidewall 113S3 and the fourth sidewall 113S4 may extend between the first sidewall 113S1 and the second sidewall 113S2. However, the shape of the casing 110 is not necessarily limited to the above-stated example, and the casing 110 may have a polygonal column-like shape (e.g., a pentagonal column-like shape or a hexagonal column-like shape) or a cylindrical shape. Hereinafter, a direction from the third sidewall 113S3 toward the fourth sidewall 113S4 will be defined as a first direction (X direction), a direction from the second sidewall 113S2 toward the first sidewall 113S1 will be defined as a second direction (Y direction), and a direction from the bottom plate 112 toward the top plate 111 will be defined as a third direction (Z direction).

The casing 110 may include an upper casing 110U and a lower casing 110L that are detachably coupled to each other. The upper casing 110U may be coupled to the lower casing 110L and may together form an accommodation space. The upper casing 110U may include the top plate 111 and at least a portion of sidewalls of the casing 110, and the lower casing 110L may include the bottom plate 112 and at least a portion of the sidewalls of the casing 110.

The casing 110 may include a material with high heat conductivity to be suitable for drawing heat generated by parts provided inside the casing 110, e.g., the first semiconductor chip 141 and/or the second semiconductor chip 143, and dissipating the drawn heat to the outside of the casing 110. For example, the heat conductivity of the casing 110 may be at least 10 W/mk. The casing 110 may include a single material or may include a combination of different materials. The casing 110 may include a metal, a carbon-based material, a polymer, or a combination thereof. For example, the casing 110 may include copper (Cu), aluminum (Al), zinc (Zn), tin (Sn), stainless steel, or a clad metal including one or more of the aforementioned metals. Alternatively, the casing 110 may include, for example, graphite, graphene, carbon fibers, a carbon nanotube composite, etc. Alternatively, the casing 110 may include, for example, an epoxy resin, polymethylmethacrylate (PMMA), polycarbonate (PC), polyethylene (PE), polypropylene (PP), etc.

The heat dissipation structure 120 may be mounted to the casing 110. The heat dissipation structure 120 may be disposed between the first substrate 131 and the second substrate 133. To fix the heat dissipation structure 120 inside the casing 110, a supporting structure for supporting the heat dissipation structure 120 may be provided inside the casing 110. For example, the heat dissipation structure 120 may be coupled to the casing 110 via a coupling means like a screw or clamp. Alternatively, the heat dissipation structure 120 may be configured to be contacted and supported by a boss structure extending from an inner wall of the casing 110.

The heat dissipation structure 120 may extend substantially in parallel with either one of the top plate 111 and the bottom plate 112 of the casing 110 inside the casing 110. The heat dissipation structure 120 may extend from the first sidewall 113S1 to the second sidewall 113S2. A first end portion 120E1 of the heat dissipation structure 120 may be inserted into a first attachment groove provided in the first sidewall 113S1 of the casing 110, and a second end portion 120E2 of the heat dissipation structure 120 may be inserted into a second attachment groove provided in the second sidewall 113S2 of the casing 110. For example, the first end portion 120E1 of the heat dissipation structure 120 may protrude from the first sidewall 113S1 of the casing 110, and the second end portion 120E2 of the heat dissipation structure 120 may protrude from the second sidewall 113S2 of the casing 110. The heat dissipation structure 120 may divide the accommodation space of the casing 110 into a lower accommodation space 114 between the heat dissipation structure 120 and the bottom plate 112 of the casing 110 and an upper accommodation space 115 between the heat dissipation structure 120 and the top plate 111 of the casing 110.

The heat dissipation structure 120 may include an inlet 127i through which the air flows in, an outlet 127o through which the air flows out, and an air passage 125 extending between the inlet 127i and the outlet 127o. The air passage 125 is a passage in which the air flows, such as a pipe, tube, or conduit, and may extend in the direction in which the heat dissipation structure 120 extends. The air passage 125 may extend from the inlet 127i to the outlet 127o in a straight direction, thereby guiding the air introduced into the air passage 125 in the straight direction. For example, the inlet 127i may be formed in the second end portion 120E2 of the heat dissipation structure 120 adjacent to the second sidewall 113S2 of the casing 110, and the outlet 127o may be formed in the first end portion 120E1 of the heat dissipation structure 120 adjacent to the first sidewall 113S1 of the casing 110. In this case, the air passage 125 extends in the second direction (Y direction), and an air flow in the second direction (Y direction) may be formed inside the air passage 125.

A cooling fan configured to force the air to flow is disposed outside of the casing 110, and the cooling fan may form an air flow mostly in the second direction (Y direction) around the solid state drive apparatus 10. Due to the operation of the cooling fan, the air introduced through the inlet 127i of the air passage 125 flows in the second direction (Y direction) along the air passage 125 and flows out of the air passage 125 through the outlet 127o of the air passage 125. While the air is flowing along the air passage 125, heat of the solid state drive apparatus 10 may be removed through heat exchange between the heat dissipation structure 120 and the air.

In example embodiments, the heat dissipation structure 120 may include a lower heat dissipation panel 121 and an upper heat dissipation panel 123 facing each other. The lower heat dissipation panel 121 may be disposed to face the bottom plate 112 of the casing 110, and the upper heat dissipation panel 123 may be disposed to face the top plate 111 of the casing 110. The lower heat dissipation panel 121 and the upper heat dissipation panel 123 may have substantially the same planar area as each other. The lower heat dissipation panel 121 and the upper heat dissipation panel 123 may have shapes that are symmetric with respect to each other. The upper heat dissipation panel 123 and the lower heat dissipation panel 121 may extend from the first sidewall 113S1 of the casing 110 to the second sidewall 113S2. The upper heat dissipation panel 123 and the lower heat dissipation panel 121 may each have a flat panel-like shape. The upper heat dissipation panel 123 and the lower heat dissipation panel 121 may each have a rectangular shape in a view from above. The center portion of the upper heat dissipation panel 123 and the center portion of the lower heat dissipation panel 121 may be spaced apart from each other in the third direction (Z direction) and form the air passage 125.

The upper heat dissipation panel 123 and the lower heat dissipation panel 121 may each include a material with excellent heat conductivity. For example, the upper heat dissipation panel 123 and the lower heat dissipation panel 121 may each include a material having heat conductivity equal to or higher than 10 W/mk. For example, the upper heat dissipation panel 123 and the lower heat dissipation panel 121 may each include Cu, gold (Au), tungsten (W), and/or Al.

A width of the air passage 125 in the first direction (X direction) may be constant along its entire length in the second direction (Y direction). The width of the air passage 125 in the first direction (X direction) may be similar to a length of the upper heat dissipation panel 123 in the first direction (X direction) and a length of the lower heat dissipation panel 121 in the first direction (X direction). A length of the air passage 125 in the second direction (Y direction) may be substantially identical to a length of the upper heat dissipation panel 123 in the second direction (Y direction) and a length of the lower heat dissipation panel 121 in the second direction (Y direction). A height 125H of the air passage 125 in the third direction (Z direction) may be substantially identical to a distance between the upper heat dissipation panel 123 and the lower heat dissipation panel 121 in the third direction (Z direction). As shown in FIG. 3, the width of the air passage 125 in the first direction (X direction) may be greater than the height 125H of the air passage 125 in the third direction (Z direction).

In example embodiments, the height 125H of the air passage 125 may range from about 3% to about 30% of a height 110H of the casing 110 in the third direction (Z direction). In example embodiments, when the height 110H of the casing 110 in the third direction (Z direction) is about 15 mm, the height 125H of the air passage 125 may range from about 0.5 mm to about 5 mm.

The first substrate 131 may be disposed in the lower accommodation space 114 between the lower heat dissipation panel 121 of the heat dissipation structure 120 and the bottom plate 112 of the casing 110, and the at least one first semiconductor chip 141 may be mounted on the first substrate 131. In example embodiments, the at least one first semiconductor chip 141 may include a first upper semiconductor chip 141U mounted to the top surface of the first substrate 131 facing the lower heat dissipation panel 121 of the heat dissipation structure 120 and a first lower semiconductor chip 141L mounted on the bottom surface of the first substrate 131 facing the bottom plate 112 of the casing 110.

The first substrate 131 may be a printed circuit board (PCB). For example, the first substrate 131 may be a double-sided PCB or a multi-layer PCB. For example, the first substrate 131 may include a base layer and one or more interconnect layers provided on the top surface and the bottom surface of the base layer. The base layer may include phenol resin, epoxy resin, and/or polyimide. The interconnect layers may include a conductive material, e.g., Al, Cu, nickel (Ni), or W. First semiconductor chips 141 and electronic parts mounted on the first substrate 131 may be electrically connected to one another through the interconnect layers of the first substrate 131.

The external connector 161 may be coupled to a first edge of the first substrate 131 adjacent to the first sidewall 113S1 of the casing 110. The external connector 161 may be exposed to the outside through a groove formed in the first sidewall 113S1 of the casing 110. The external connector 161 may be configured to be inserted into a socket of an external device to electrically connect the external device to the solid state drive apparatus 10. Through the external connector 161, the solid state drive apparatus 10 may transmit/receive electric signals to/from the external device and receive power needed for operation from the external device.

The second substrate 133 may be disposed in the upper accommodation space 115 between the upper heat dissipation panel 123 of the heat dissipation structure 120 and the top plate 111 of the casing 110. The at least one second semiconductor chip 143 may be mounted on the second substrate 133. In example embodiments, the at least one second semiconductor chip 143 may include a second upper semiconductor chip 143U mounted on the top surface of the second substrate 133 facing the top plate 111 of the casing 110 and a second lower semiconductor chip 143L mounted on the bottom surface of the second substrate 133 facing the upper heat dissipation panel 123 of the heat dissipation structure 120. The second substrate 133 may be a PCB. Second semiconductor chips 143 and electronic parts mounted on the second substrate 133 may be electrically connected to one another through interconnect layers of the second substrate 133.

The first substrate 131 and the second substrate 133 may be electrically connected to each other through a connection substrate 135. The connection substrate 135 may extend between an edge of the first substrate 131 and an edge of the second substrate 133. The connection substrate 135 may extend to surround a side of the heat dissipation structure 120. The connection substrate 135 may include a flexible PCB, for example.

The at least one first semiconductor chip 141 and the at least one second semiconductor chip 143 may each include a controller chip, a first memory semiconductor chip, and a second memory semiconductor chip.

The controller chip may control the first memory semiconductor chip and the second memory semiconductor chip. A control circuit may be embedded in the controller chip. The control circuit of the controller chip may control accesses to data stored in the first memory semiconductor chip and the second memory semiconductor chip. The control circuit of the controller chip may control write/read operations regarding a flash memory or the like according to control instructions from an external host. The control circuit of the controller chip may be implemented as a separate control semiconductor chip like an application specific integrated circuit (ASIC) or may be part of semiconductor chip performing a different function. The control circuit of the controller chip may be configured to, for example, be automatically executed by an operating system of an external host when the solid state drive apparatus 10 is connected to the external host. The control circuit of the controller chip may provide a standard protocol like parallel advanced technology attachment (PATA), serial advanced technology attachment (SATA), a SCSI standard, or PCI express (PCIe). Also, the control circuit of the controller chip may perform wear leveling, garbage collection, bad block management, and error correcting code for driving a non-volatile memory device. In this case, the control circuit of the controller chip may include a script for the automatic execution and an application program that may be executed by the external host.

The first memory semiconductor chip may be a non-volatile memory device. The non-volatile memory device may be, but is not limited to being, flash memory, phase change random access memory (PRAM), resistive RAM (RAM), ferroelectric RAM (FeRAM), and magnetic RAM (MRAM). The flash memory may be, for example, a NAND flash memory. The flash memory may be, for example, a V-NAND flash memory. The non-volatile memory device may include one semiconductor die or may include a stack of a plurality of semiconductor dies.

The second memory semiconductor chip may be a volatile memory device. The volatile memory device may be, but is not limited to being, dynamic RAM (DRAM) and static RAM (SRAM). The volatile memory device may provide a cache function for storing data frequently used when the external host accesses the solid state drive apparatus 10, thereby scaling an access time and data transfer performance in correspondence to processing performance of the external host connected to the solid state drive apparatus 10.

Also, a resistor, a capacitor, an inductor, a switch, a temperature sensor, a DC-DC converter, an active device, and/or a passive device may be further mounted on the first substrate 131 and/or the second substrate 133.

A thermal interface material (TIM) may be arranged between the first upper semiconductor chip 141U and the lower heat dissipation panel 121 of the heat dissipation structure 120, between the first lower semiconductor chip 141L and the bottom plate 112 of the casing 110, between the second upper semiconductor chip 143U and the top plate 111 of the casing 110, and between the second lower semiconductor chip 143L and the lower heat dissipation panel 121 of the heat dissipation structure 120. The TIM may include a thermal paste, a thermal adhesive, a gap filler, and/or a thermal conductive pad.

In example embodiments, a first TIM 151 may be disposed between the first upper semiconductor chip 141U and the lower heat dissipation panel 121 to strengthen physical coupling and thermal coupling between the first upper semiconductor chip 141U and the lower heat dissipation panel 121. Heat generated by the first upper semiconductor chip 141U may be conducted through the first TIM 151 and the lower heat dissipation panel 121.

In example embodiments, a second TIM 153 may be disposed between the first lower semiconductor chip 141L and the bottom plate 112 of the casing 110 to strengthen physical coupling and thermal coupling between the first lower semiconductor chip 141L and the bottom plate 112 of the casing 110. Heat generated by the first lower semiconductor chip 141L may be conducted through the second TIM 153 and the bottom plate 112.

In example embodiments, a third TIM 155 may be disposed between the second lower semiconductor chip 143L and the upper heat dissipation panel 123 of the heat dissipation structure 120 to strengthen physical coupling and thermal coupling between the second lower semiconductor chip 143L and the upper heat dissipation panel 123 of the heat dissipation structure 120. Heat generated by the second lower semiconductor chip 143L may be conducted through the third TIM 155 and the upper heat dissipation panel 123.

In example embodiments, a fourth TIM 157 may be disposed between the second upper semiconductor chip 143U and the top plate 111 of the casing 110 to strengthen physical coupling and thermal coupling between the second upper semiconductor chip 143U and the top plate 111 of the casing 110. Heat generated by the second upper semiconductor chip 143U may be conducted through the fourth TIM 157 and the top plate 111.

In example embodiments, the air passage 125 of the heat dissipation structure 120 may be isolated from the space provided between outer surfaces of the heat dissipation structure 120 and the casing 110. For example, the air passage 125 of the heat dissipation structure 120 may be isolated from the lower accommodation space 114 and the upper accommodation space 115 of the casing 110 by the lower heat dissipation panel 121 and the upper heat dissipation panel 123. For example, the air passage 125 of the heat dissipation structure 120 might not communicate with the lower accommodation space 114 of the casing 110 and might not communicate with the upper accommodation space 115 of the casing 110. Because the air passage 125 of the heat dissipation structure 120 is isolated from the lower accommodation space 114 of the casing 110, foreign materials like dust introduced with the air may be prevented from entering the lower accommodation space 114. In the same regard, because the air passage 125 of the heat dissipation structure 120 is isolated from the upper accommodation space 115 of the casing 110, foreign materials introduced with the air may be prevented from entering the upper accommodation space 115.

In example embodiments, when the upper heat dissipation panel 123 and the lower heat dissipation panel 121 each have two edges extending in parallel with the second direction (Y direction), two edges of the upper heat dissipation panel 123 may be adhered to two edges of the lower heat dissipation panel 121. The lower heat dissipation panel 121 may include a first edge 121E1 adjacent to the third sidewall 113S3 of the casing 110 and a second edge 121E2 adjacent to the fourth sidewall 113S4 of the casing 110, whereas the upper heat dissipation panel 123 may include a first edge 123E1 adjacent to the third sidewall 113S3 of the casing 110 and a second edge 123E2 adjacent to the fourth sidewall 113S4 of the casing 110. At this time, the first edge 121E1 of the lower heat dissipation panel 121 may be coupled to the first edge 123E1 of the upper heat dissipation panel 123, whereas the second edge 121E2 of the lower heat dissipation panel 121 may be coupled to the second edge 123E2 of the upper heat dissipation panel 123. An edge of lower heat dissipation panel 121 and an edge of the upper heat dissipation panel 123 adjacent to the second sidewall 113S2 may be partially spaced apart from each other to form the inlet 127i. An edge of the lower heat dissipation panel 121 and an edge of the upper heat dissipation panel 123 adjacent to the first sidewall 113S1 of the casing 110 may be partially spaced apart from each other to form the outlet 127o.

In example embodiments, the first edge 121E1 of the lower heat dissipation panel 121 may include a sloped portion 191a extending outwardly along an upward slope and a first lower adhering portion 191b extending further outward from the sloped portion 191a, whereas the first edge 123E1 of the upper heat dissipation panel 123 may include a sloped portion 193a extending outwardly along a downward slope and a first upper adhering portion 193b extending further outward from the sloped portion 193a. The first upper adhering portion 193b of the first edge 123E1 of the upper heat dissipation panel 123 may be adhered to the first lower adhering portion 191b of the first edge 121E1 of the lower heat dissipation panel 121. The first edge 123E1 of the upper heat dissipation panel 123 and the first edge 121E1 of the lower heat dissipation panel 121 contact each other across an entirety of the direction in which the air passage 125 extends, thereby preventing the air inside the air passage 125 from being leaked in a direction toward the third sidewall 113S3 of the casing 110 from the air passage 125.

In example embodiments, the second edge 121E2 of the lower heat dissipation panel 121 may include a sloped portion 191c extending outwardly along an upward slope and a second lower adhering portion 191d extending further outward from the sloped portion 191c, whereas the second edge 123E2 of the upper heat dissipation panel 123 may include a sloped portion 193c extending outwardly along a downward slope and a second upper adhering portion 193d extending further outward from the sloped portion 193c. The second upper adhering portion 193d of the second edge 123E2 of the upper heat dissipation panel 123 may be adhered to the second lower adhering portion 191d of the second edge 121E2 of the lower heat dissipation panel 121. The second edge 123E2 of the upper heat dissipation panel 123 and the second edge 121E2 of the lower heat dissipation panel 121 contact each other across an entirety of the direction in which the air passage 125 extends, thereby preventing the air inside the air passage 125 from being leaked in a direction toward the fourth sidewall 113S4 of the casing 110 from the air passage 125.

As the performance of electronic devices like a central processing unit (CPU), a memory, and a storage increases, adequate heat dissipation becomes increasingly important. One way in which heat is managed in such devices is to throttle performance as heat builds up. Thus, full utilization of the performance of such electronic devices hinges on there being adequate heat dissipation. The performance of an electronic device increases as input/output (I/O) speeds increase. However, on the other hand, a thermal issue occurs due to higher power consumption, and the thermal issue may deteriorate the reliability of the solid state drive apparatus 10.

According to example embodiments of the inventive concept, the heat dissipation structure 120 is provided inside the casing 110 of the solid state drive apparatus 10. Heat generated by parts inside the solid state drive apparatus 10 may be cooled through a conduction heat transfer and a convective heat transfer via the heat dissipation structure 120. Therefore, the heat dissipation efficiency of the solid state drive apparatus 10 including the heat dissipation structure 120 may be increased, thereby maximizing performance utilization and increasing the reliability of the solid state drive apparatus 10.

Figure 6:
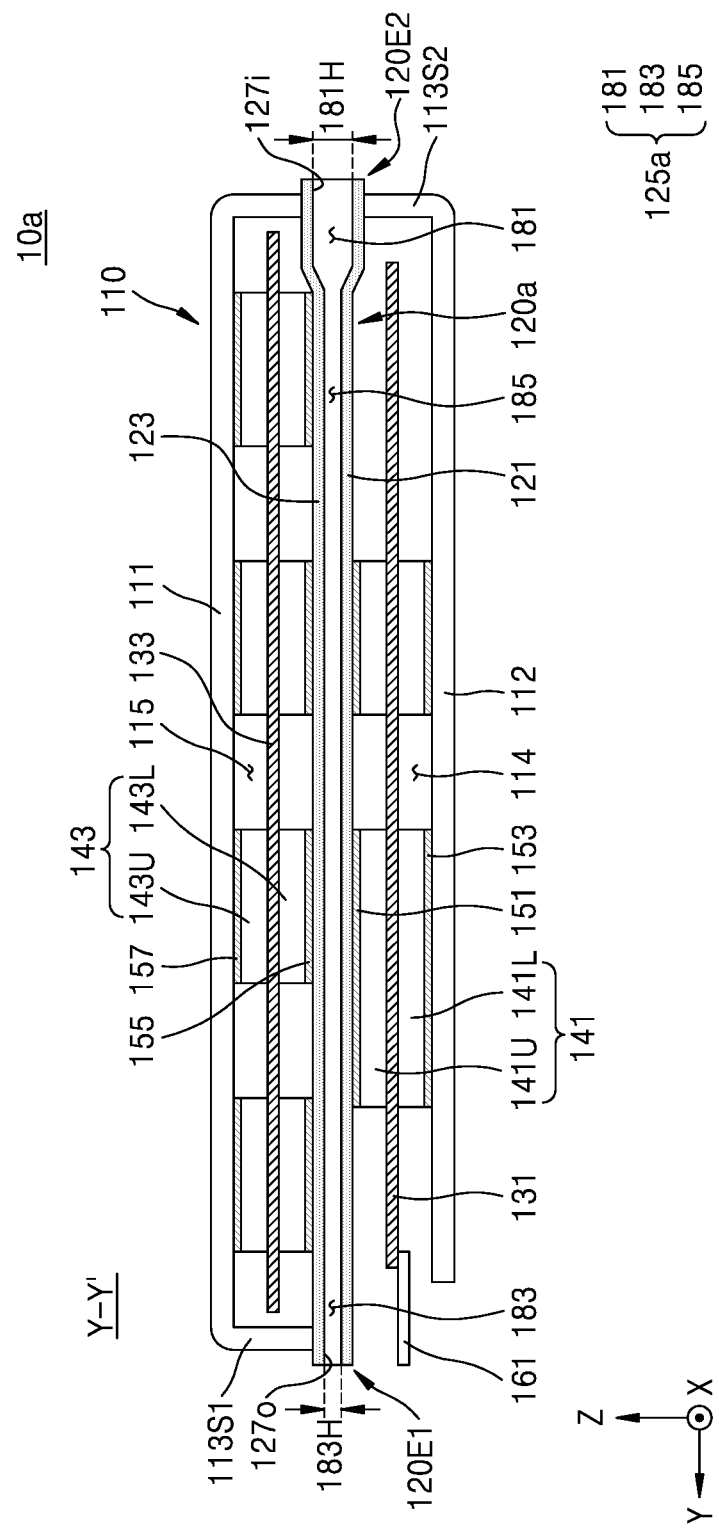
FIG. 6 is a cross-sectional view of a solid state drive apparatus according to example embodiments of the inventive concept.

FIG. 6 is a cross-sectional view of a solid state drive apparatus 10a according to example embodiments of the inventive concept. Hereinafter, the solid state drive apparatus 10a shown in FIG. 6 will be described based on differences from the solid state drive apparatus 10 described above with reference to FIGS. 1 to 5. To the extent that various elements are not described, these elements may be understood to be at least similar to corresponding elements that have been described elsewhere in the instant specification.

Referring to FIG. 6, a height of an air passage 125a may vary according to a location of the air passage 125a in the second direction (Y direction).

The air passage 125a may include a first segment 181 extending a predetermined distance from the inlet 127i of the air passage 125a toward the outlet 127o, a second segment 183 extending a predetermined distance from the outlet 127o of the air passage 125a toward the inlet 127i, and a third segment 185 extending between the first segment 181 and the second segment 183. In example embodiments, at least one of a height 181H of the first segment 181 in the third direction (Z direction), a height 183H of the second segment 183 in the third direction (Z direction), and a height of the third segment 185 in the third direction (Z direction) may be different from the others.

In example embodiments, the height 181H of the first segment 181 of the air passage 125a may be greater than the height 183H of the second segment 183 of the air passage 125a and the height of the third segment 185 of the air passage 125a. In example embodiments, the height 181H of the first segment 181 of the air passage 125a may be from about 1.5 times to about 10 times the height 183H of the second segment 183 of the air passage 125a.

Because the height 181H of the first segment 181 of the air passage 125a is greater than the height 183H of the second segment 183 of the air passage 125a, the size or the area of the inlet 127i of the air passage 125a may be larger than the size or the area of the outlet 127o of the air passage 125a. In this case, the flux of the air flowing into the air passage 125a may increase, thereby increasing the heat dissipation efficiency of the heat dissipation structure 120a.

Figure 7:
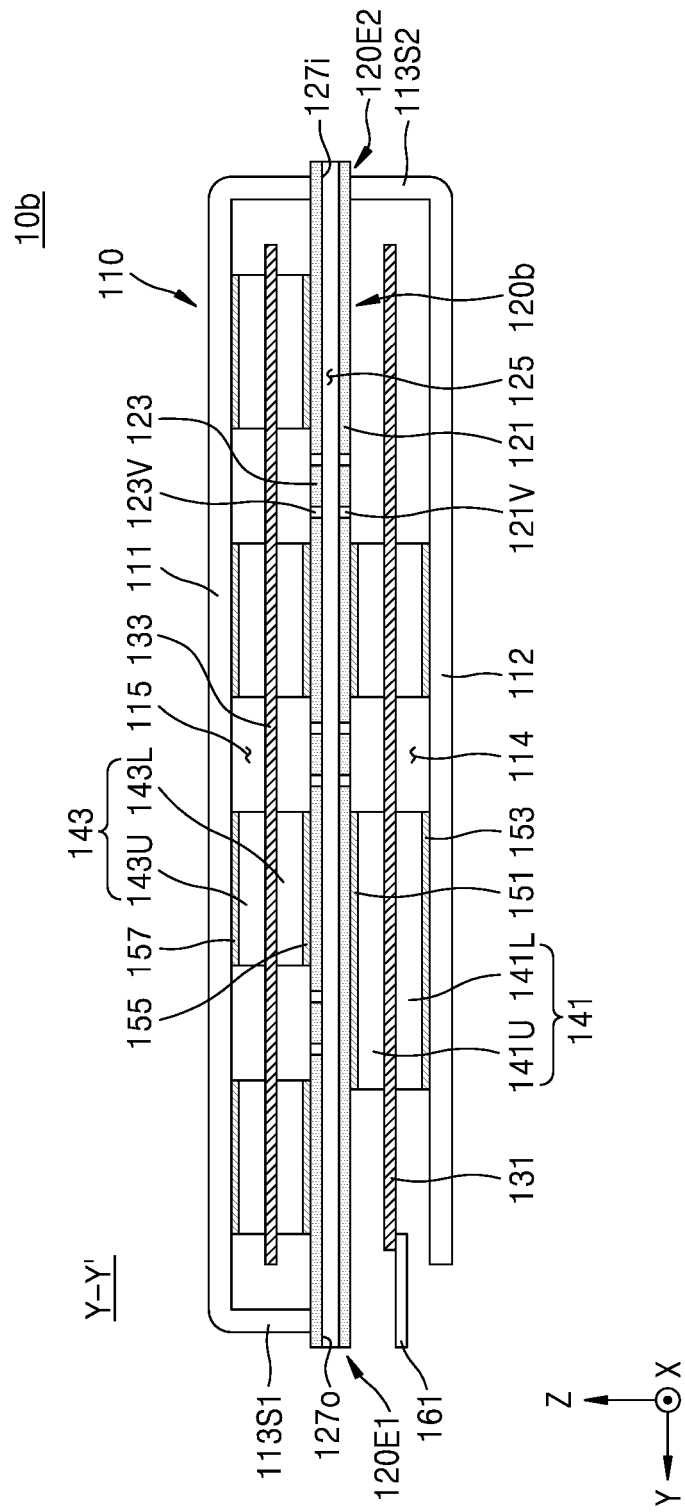
FIG. 7 is a cross-sectional view of a solid state drive apparatus according to example embodiments of the inventive concept.
Figure 8:
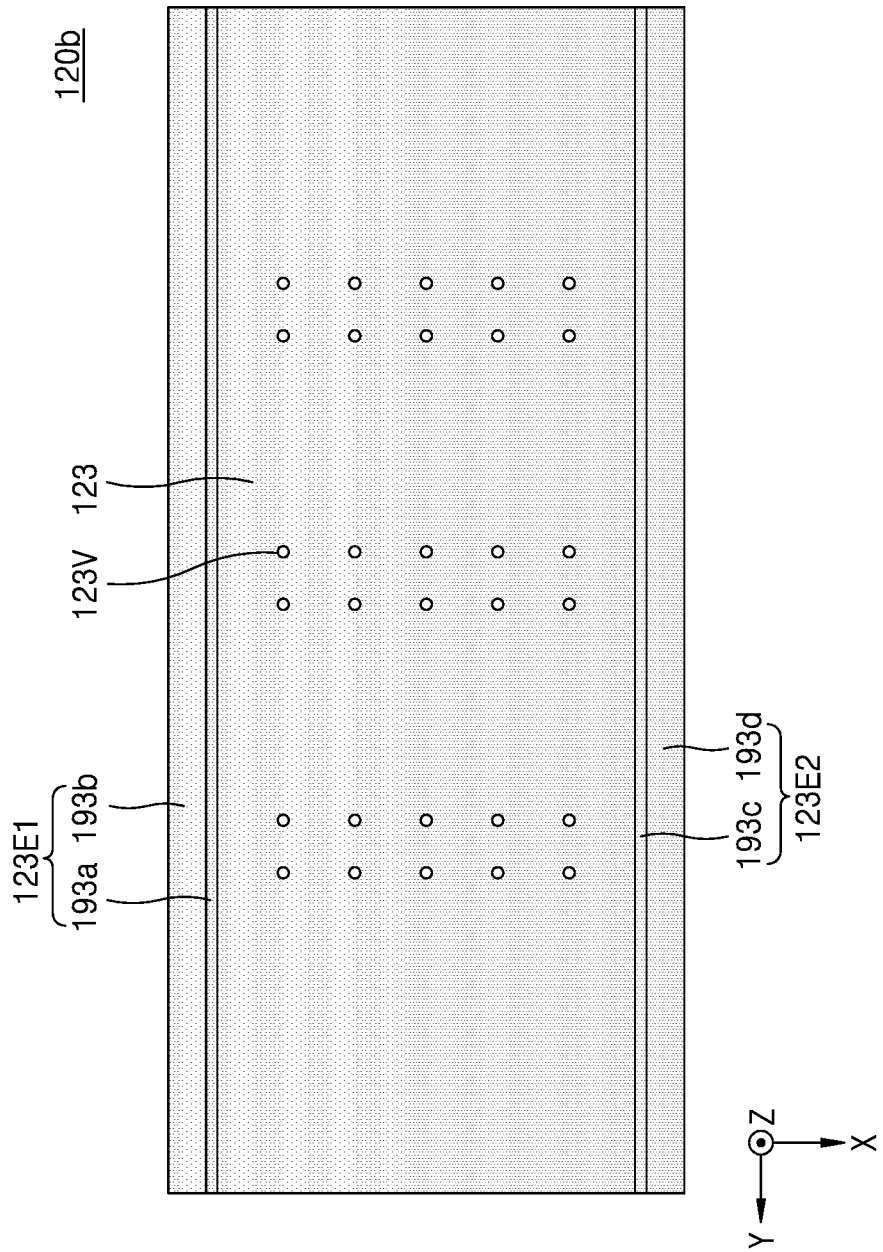
FIG. 8 is a plan view of a heat dissipation structure included in the solid state drive apparatus of FIG. 7.

FIG. 7 is a cross-sectional view of a solid state drive apparatus 10b according to example embodiments of the inventive concept. FIG. 8 is a plan view of a heat dissipation structure 120b included in the solid state drive apparatus 10b of FIG. 7. Hereinafter, the heat dissipation structure 120b and the solid state drive apparatus 10b shown in FIGS. 7 and 8 will be described based on differences from the heat dissipation structure 120 and the solid state drive apparatus 10 described above with reference to FIGS. 1 to 5. To the extent that various elements are not described, these elements may be understood to be at least similar to corresponding elements that have been described elsewhere in the instant specification.

Referring to FIGS. 7 and 8, at least one of the upper heat dissipation panel 123 and the lower heat dissipation panel 121 may include a vent hole. Through the vent hole, the space provided between outer surfaces of the heat dissipation structure 120b and the casing 110 may communicate with the air passage 125 formed inside the heat dissipation structure 120b.

In example embodiments, the lower heat dissipation panel 121 may include a first vent hole 121V through which the air passage 125 of the heat dissipation structure 120b communicates with the lower accommodation space 114. The lower heat dissipation panel 121 may include one or a plurality of first vent holes 121V. While the air introduced into the air passage 125 is flowing in the second direction (Y direction) at a high speed, heated air inside the lower accommodation space 114 may flow into the air passage 125 through the first vent hole 121V. The heated air inside the lower accommodation space 114 flows into the air passage 125 through the first vent hole 121V and exits through the outlet 127o of the air passage 125 together with the air introduced through the inlet 127i of the air passage 125, and thus, heat dissipation efficiency regarding the lower accommodation space 114 and parts accommodated in the lower accommodation space 114 may be increased.

In example embodiments, the upper heat dissipation panel 123 may include a second vent hole 123V through which the air passage 125 of the heat dissipation structure 120b communicates with the upper accommodation space 115. The upper heat dissipation panel 123 may include one or a plurality of second vent holes 123V. While the air introduced into the air passage 125 is flowing in the second direction (Y direction) at a high speed, heated air inside the upper accommodation space 115 may flow into the air passage 125 through the second vent hole 123V. The heated air inside the upper accommodation space 115 flows into the air passage 125 through the second vent hole 123V and exits through the outlet 127o of the air passage 125 together with the air introduced through the inlet 127i of the air passage 125, and thus, heat dissipation efficiency regarding the upper accommodation space 115 and parts accommodated in the upper accommodation space 115 may be increased.

Figure 9:
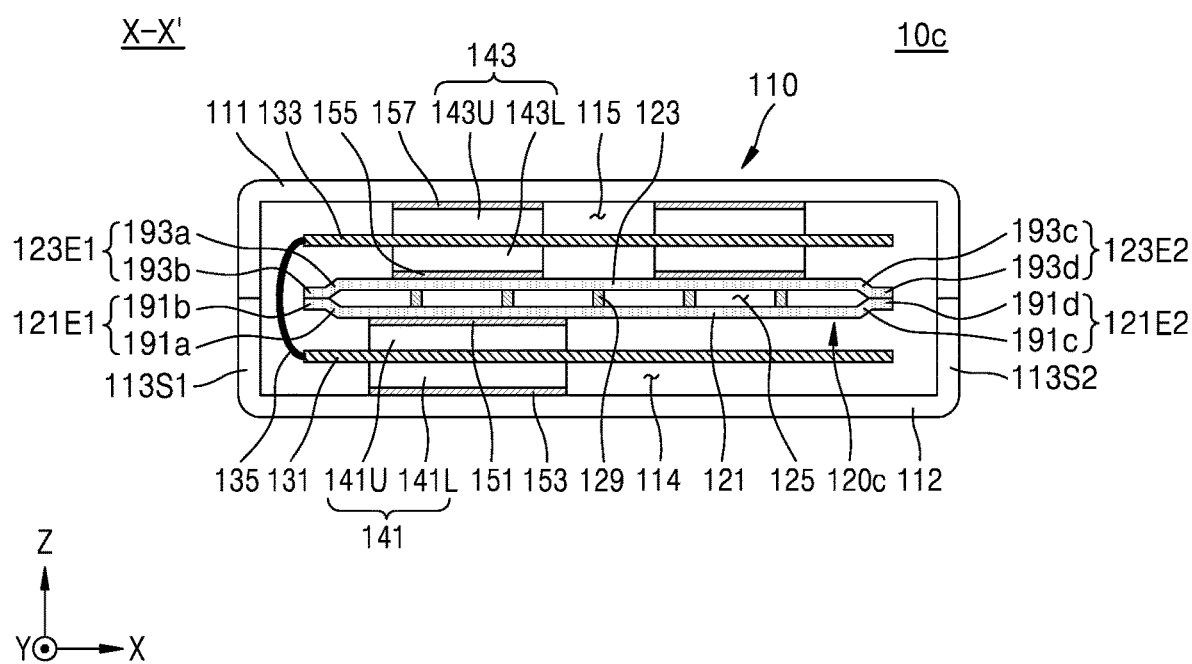
FIG. 9 is a cross-sectional view of a solid state drive apparatus according to example embodiments of the inventive concept.
Figure 10:
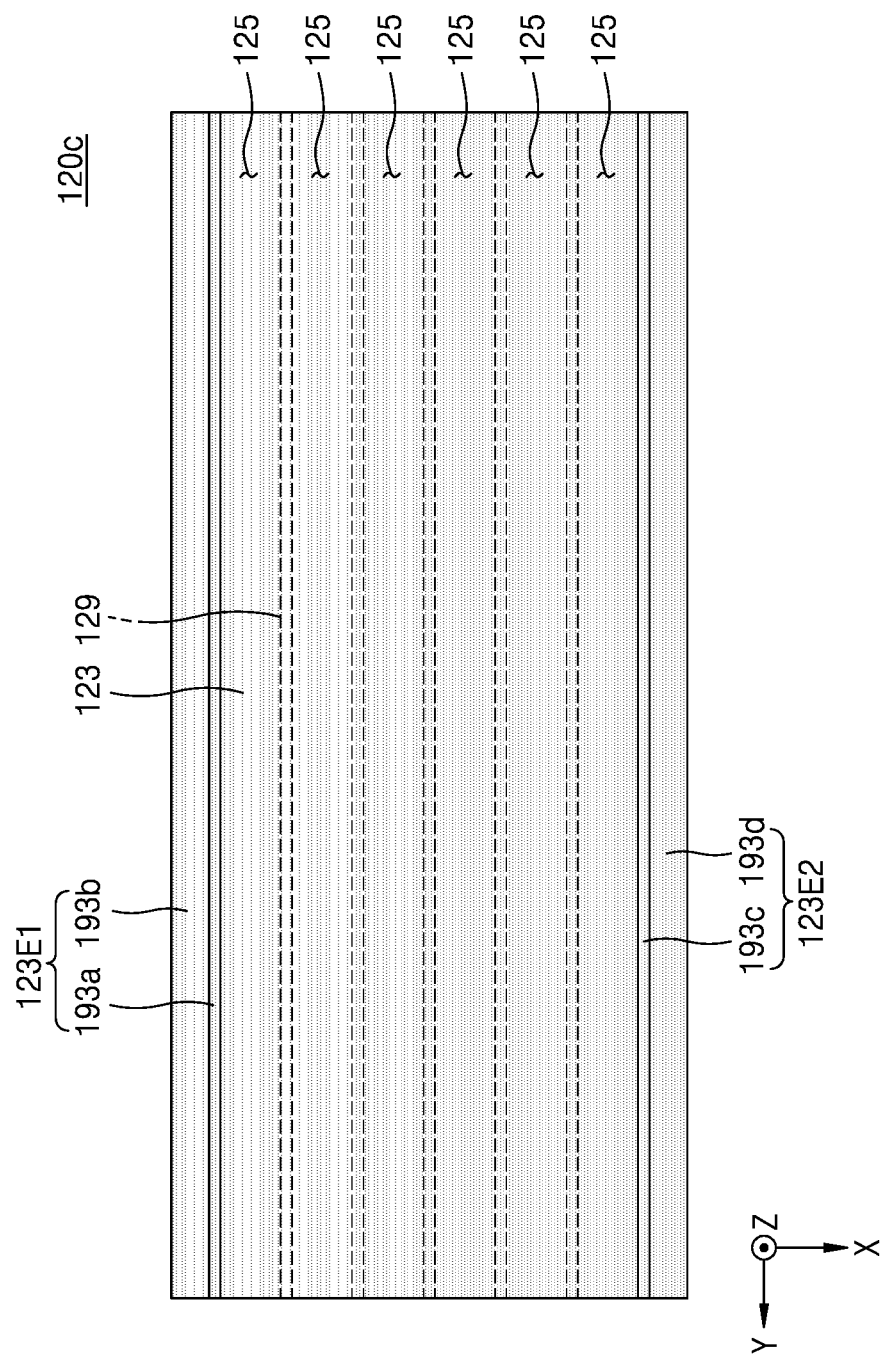
FIG. 10 is a plan view of a heat dissipation structure included in the solid state drive apparatus of FIG. 9.

FIG. 9 is a cross-sectional view of a solid state drive apparatus 10c according to example embodiments of the inventive concept. FIG. 10 is a plan view of a heat dissipation structure 120c included in the solid state drive apparatus 10c of FIG. 9. Hereinafter, the heat dissipation structure 120c and the solid state drive apparatus 10c shown in FIGS. 9 and 10 will be described based on differences from the heat dissipation structure 120 and the solid state drive apparatus 10 described above with reference to FIGS. 1 to 5. To the extent that various elements are not described, these elements may be understood to be at least similar to corresponding elements that have been described elsewhere in the instant specification.

Referring to FIGS. 9 and 10, the heat dissipation structure 120c may include at least one isolation wall 129.

The at least one isolation wall 129 may extend in the third direction (Z direction) between the lower heat dissipation panel 121 and the upper heat dissipation panel 123. The at least one isolation wall 129 may extend substantially in the second direction (Y direction) from the first end portion (120E1 of FIG. 4) of the heat dissipation structure 120c at which the outlet (127o of FIG. 4) is formed to the second end portion (120E2 of FIG. 4) of the heat dissipation structure 120c at which the inlet (127i of FIG. 4) is formed. The at least one isolation wall 129 may be connected to the lower heat dissipation panel 121 across its entirety. The at least one isolation wall 129 may be connected to the upper heat dissipation panel 123 across its entirety. The heat dissipation structure 120c may include one isolation wall 129 or may include a plurality of isolation walls 129 spaced apart from one another in the first direction (X direction). Because the heat dissipation structure 120c includes the at least one isolation wall 129, the heat dissipation structure 120c may include a plurality of air passages 125 isolated from each other by the at least one isolation wall 129.

The isolation wall 129 may contribute to formation of an air flow in the second direction (Y direction) inside the air passage 125 and may suppress formation of an eddy current that interferes with heat transfer between the upper heat dissipation panel 123 and the air and heat transfer between the lower heat dissipation panel 121 and the air.

Figure 11:
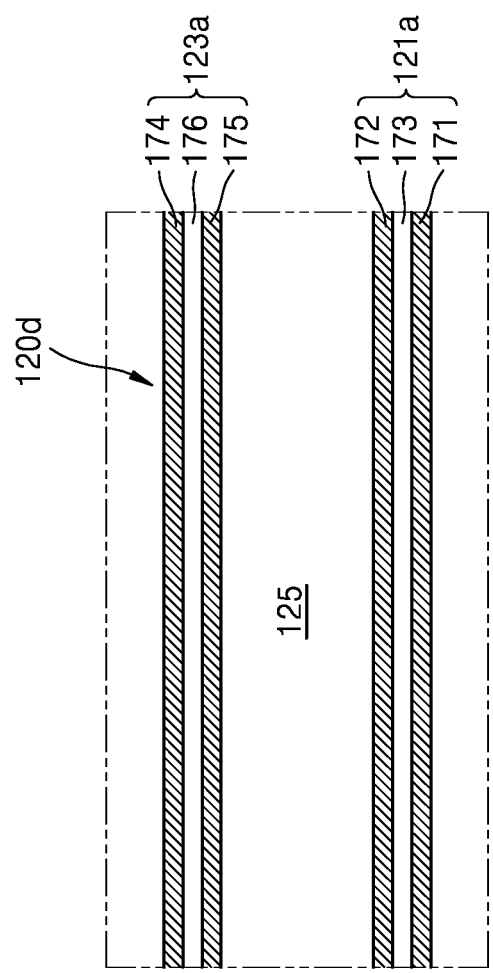
FIG. 11 is a cross-sectional view of a heat dissipation structure according to example embodiments of the inventive concept.

FIG. 11 is a cross-sectional view of a heat dissipation structure 120d according to example embodiments of the inventive concept. Hereinafter, the heat dissipation structure 120d shown in FIG. 11 will be described based on differences from the heat dissipation structure 120 of the solid state drive apparatus 10 described above with reference to FIGS. 1 to 5. To the extent that various elements are not described, these elements may be understood to be at least similar to corresponding elements that have been described elsewhere in the instant specification.

Referring to FIG. 11, at least one of a lower heat dissipation panel 121a and an upper heat dissipation panel 123a of the heat dissipation structure 120d may have a vapor chamber structure.

In example embodiments, the lower heat dissipation panel 121a may include a first outer plate 171 contacting the first semiconductor chip (141 of FIG. 4), a first inner plate 172 contacting the air passage 125, and a first vapor channel 173 provided between the first outer plate 171 and the first inner plate 172. The first vapor channel 173 may be a space provided between the first outer plate 171 and the first inner plate 172, such that a working fluid flows therein. The first outer plate 171 and the first inner plate 172 may each include a metal, for example. For example, the first outer plate 171 and the first inner plate 172 may each include Al, Ni, titanium (Ti), magnesium (Mg), or a combination thereof. For example, the working fluid may flow into the first vapor channel 173 through an inlet formed in the lower heat dissipation panel 121a and may penetrate into the first vapor channel 173 by the capillary pressure.

In example embodiments, the upper heat dissipation panel 123a may include a second outer plate 174 contacting the second semiconductor chip (143 of FIG. 4), a second inner plate 175 contacting the air passage 125, and a second vapor channel 176 provided between the second outer plate 174 and the second inner plate 175. The second vapor channel 176 may be a space provided between the second outer plate 174 and the second inner plate 175, such that a working fluid flows therein. The second outer plate 174 and the second inner plate 175 may each include a metal, for example. For example, the second outer plate 174 and the second inner plate 175 may each include Al, Ni, Ti, Mg, or a combination thereof. For example, the working fluid may flow into the second vapor channel 176 through an inlet formed in the upper heat dissipation panel 123a and may penetrate into the second vapor channel 176 by the capillary pressure.

When heat is applied to the first outer plate 171 and the second outer plate 174, working fluids in the first vapor channel 173 and the second vapor channel 176 absorb the heat and are evaporated, and vapor formed as the working fluids are evaporated may be condensed by the first inner plate 172 and the second inner plate 175 having relatively low temperatures through heat conduction with the air flowing in the air passage 125. Through the phase change of the working fluids, parts around the heat dissipation structure 120d may be cooled.

Figure 12:
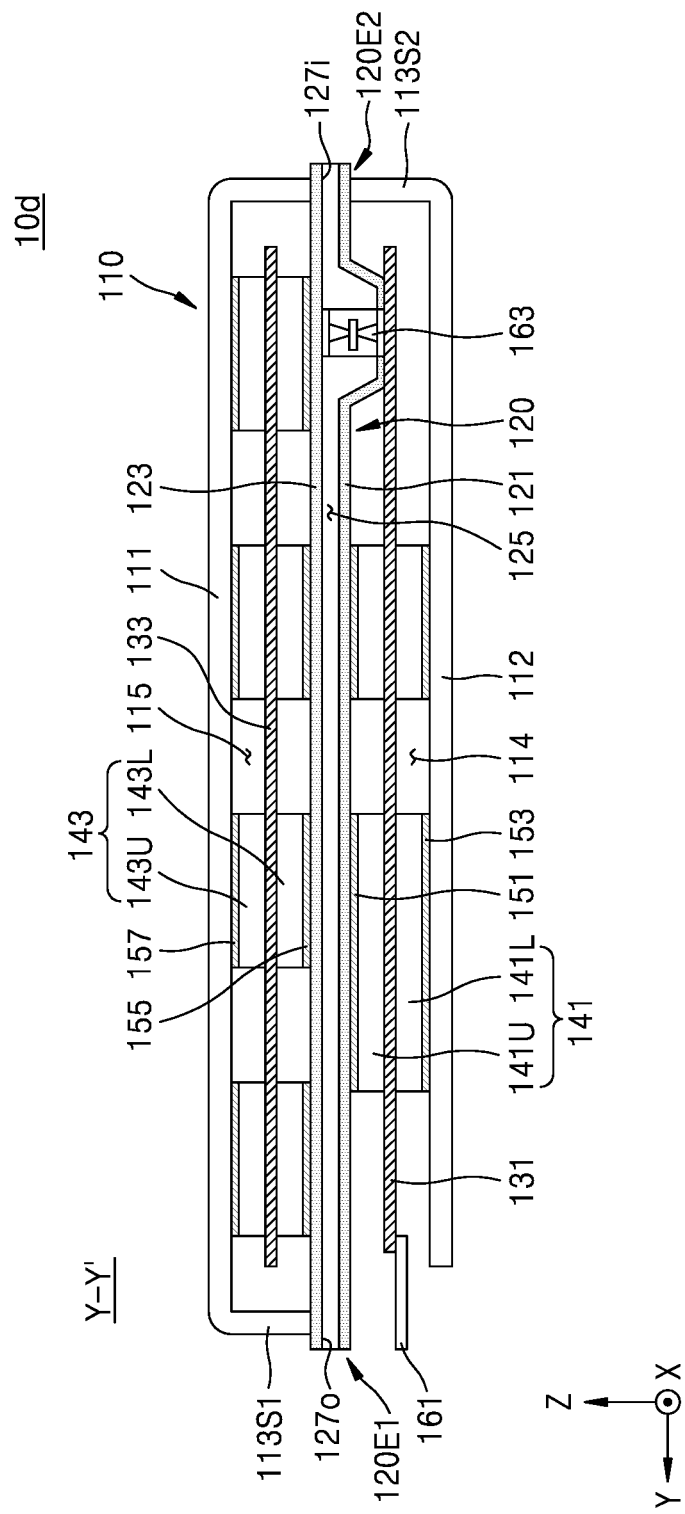
FIG. 12 is a cross-sectional view of a solid state drive apparatus according to example embodiments of the inventive concept.

FIG. 12 is a cross-sectional view of a solid state drive apparatus 10d according to example embodiments of the inventive concept. Hereinafter, the solid state drive apparatus 10d shown in FIG. 12 will be described based on differences from the solid state drive apparatus 10 described above with reference to FIGS. 1 to 5. To the extent that various elements are not described, these elements may be understood to be at least similar to corresponding elements that have been described elsewhere in the instant specification.

Referring to FIG. 12, the solid state drive apparatus 10d may include a first blowing fan 163 provided inside the casing 110. At least a portion of the first blowing fan 163 may be accommodated inside the heat dissipation structure 120. For example, a portion of the first blowing fan 163 may be located inside the air passage 125 through a hole formed in the lower heat dissipation panel 121. The first blowing fan 163 may be configured to inject the air into the air passage 125 through a hole formed in the lower heat dissipation panel 121. The first blowing fan 163 may be configured to force an air flow inside the air passage 125 of the heat dissipation structure 120. For example, the first blowing fan 163 may be mounted on the first substrate 131 and may be configured to receive power and a control signal needed to be driven through the first substrate 131. One first blowing fan 163 or a plurality of first blowing fans 163 may be mounted on the first substrate 131.

The first blowing fan 163 may be driven to form an air flow from the inlet 127i toward the outlet 127o inside the air passage 125 of the heat dissipation structure 120. The first blowing fan 163 may be disposed adjacent to the inlet 127i of the air passage 125 and may be configured to blow the air in the second direction (Y direction). The first blowing fan 163 may be mounted on the first substrate 131, such that a direction in which the first blowing fan 163 blows the air is substantially parallel to the second direction (Y direction) in which the air passage 125 extends. When the first blowing fan 163 is driven, the flowing speed of the air flowing in the second direction (Y direction) inside the air passage 125 increases, and thus, heat transfer efficiency between the air flowing in the air passage 125 and the heat dissipation structure 120 may be increased.

Figure 13:
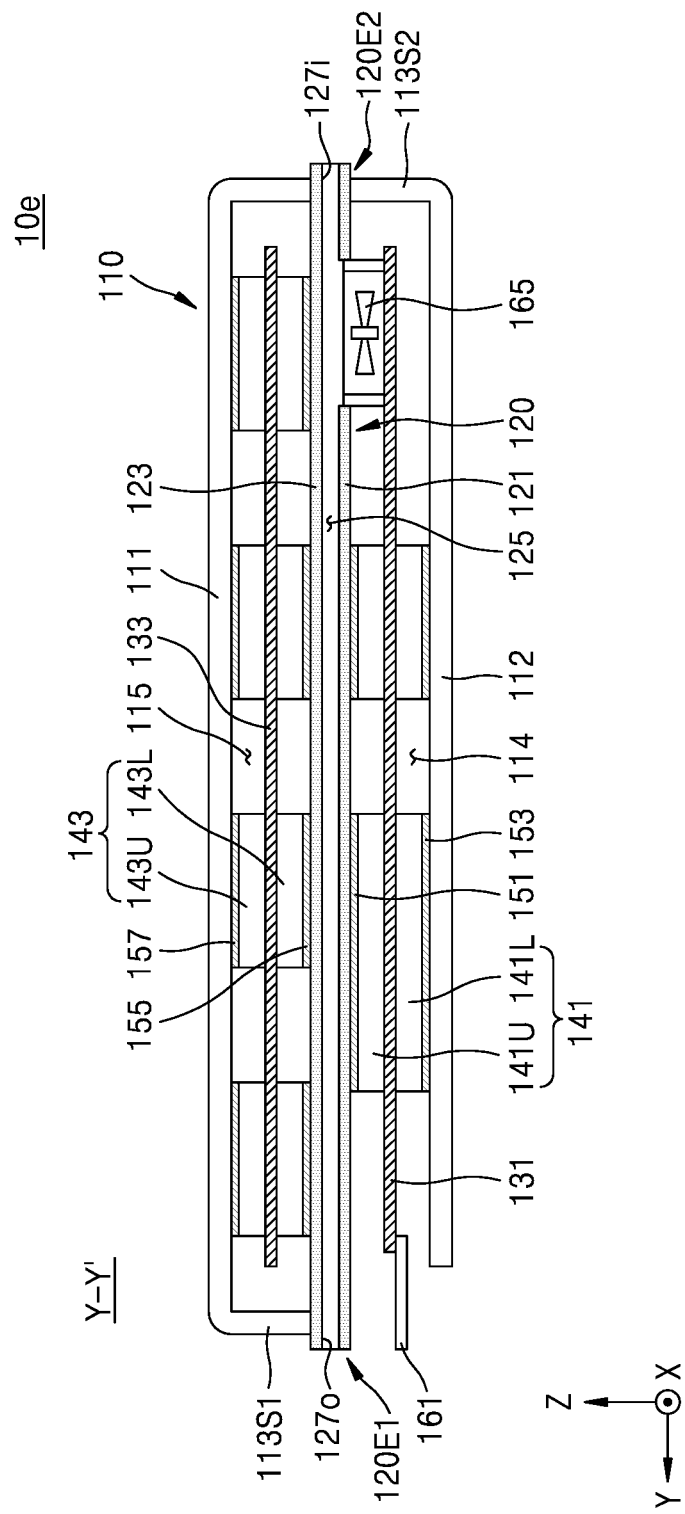
FIG. 13 is a cross-sectional view of a solid state drive apparatus according to example embodiments of the inventive concept.

FIG. 13 is a cross-sectional view of a solid state drive apparatus 10e according to example embodiments of the inventive concept. Hereinafter, the solid state drive apparatus 10e shown in FIG. 13 will be described based on differences from the solid state drive apparatus 10 described above with reference to FIGS. 1 to 5. To the extent that various elements are not described, these elements may be understood to be at least similar to corresponding elements that have been described elsewhere in the instant specification.

Referring to FIG. 13, the solid state drive apparatus 10e may include a second blowing fan 165 provided inside the casing 110. At least a portion of the second blowing fan 165 may be accommodated inside the heat dissipation structure 120. The second blowing fan 165 may be configured to inject the air into the air passage 125 through a hole formed in the lower heat dissipation panel 121. The second blowing fan 165 may be configured to force an air flow inside the air passage 125 of the heat dissipation structure 120. For example, the second blowing fan 165 may be mounted on the first substrate 131 and may be configured to receive power and a control signal needed to be driven through the first substrate 131. One second blowing fan 165 or a plurality of second blowing fans 165 may be mounted on the first substrate 131.

The second blowing fan 165 may be disposed adjacent to the inlet 127i of the air passage 125 and may be configured to blow the air in third direction (Z direction). For example, the second blowing fan 165 may be mounted on the first substrate 131, such that a direction in which the second blowing fan 165 blows the air is identical to a direction from the bottom plate 112 of the casing 110 toward the top plate 111. When the second blowing fan 165 is driven, the flowing speed of the air inside the air passage 125 increases, and thus, heat transfer efficiency between the air flowing in the air passage 125 and the heat dissipation structure 120 may be increased.

Figure 14:
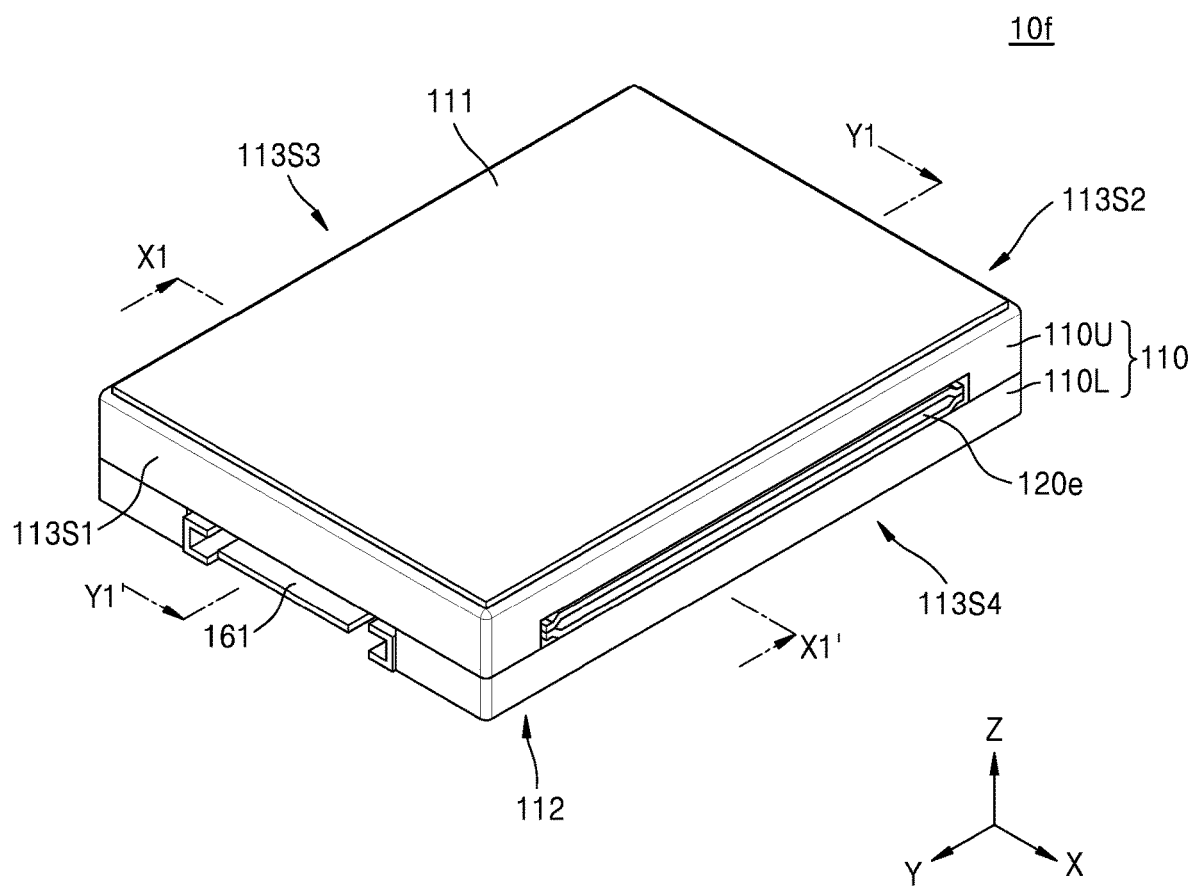
FIG. 14 is a perspective view of a solid state drive apparatus according to example embodiments of the inventive concept.
Figure 15:
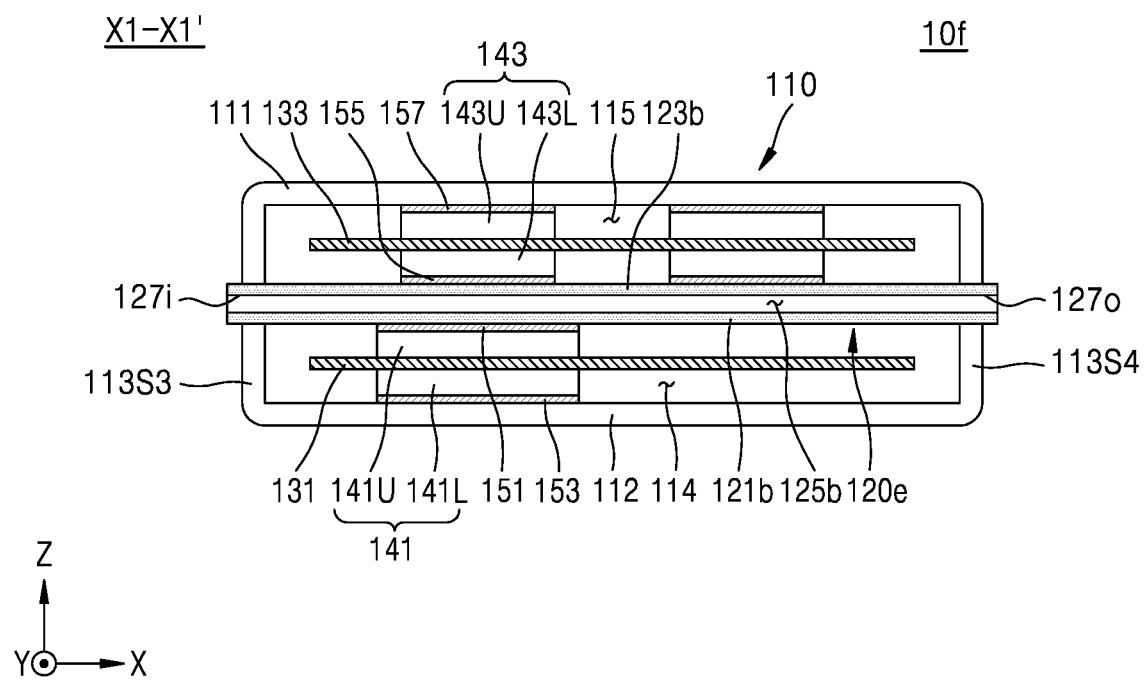
FIG. 15 is a cross-sectional view of the solid state drive apparatus along a line X1-X1' of FIG. 14.
Figure 16:
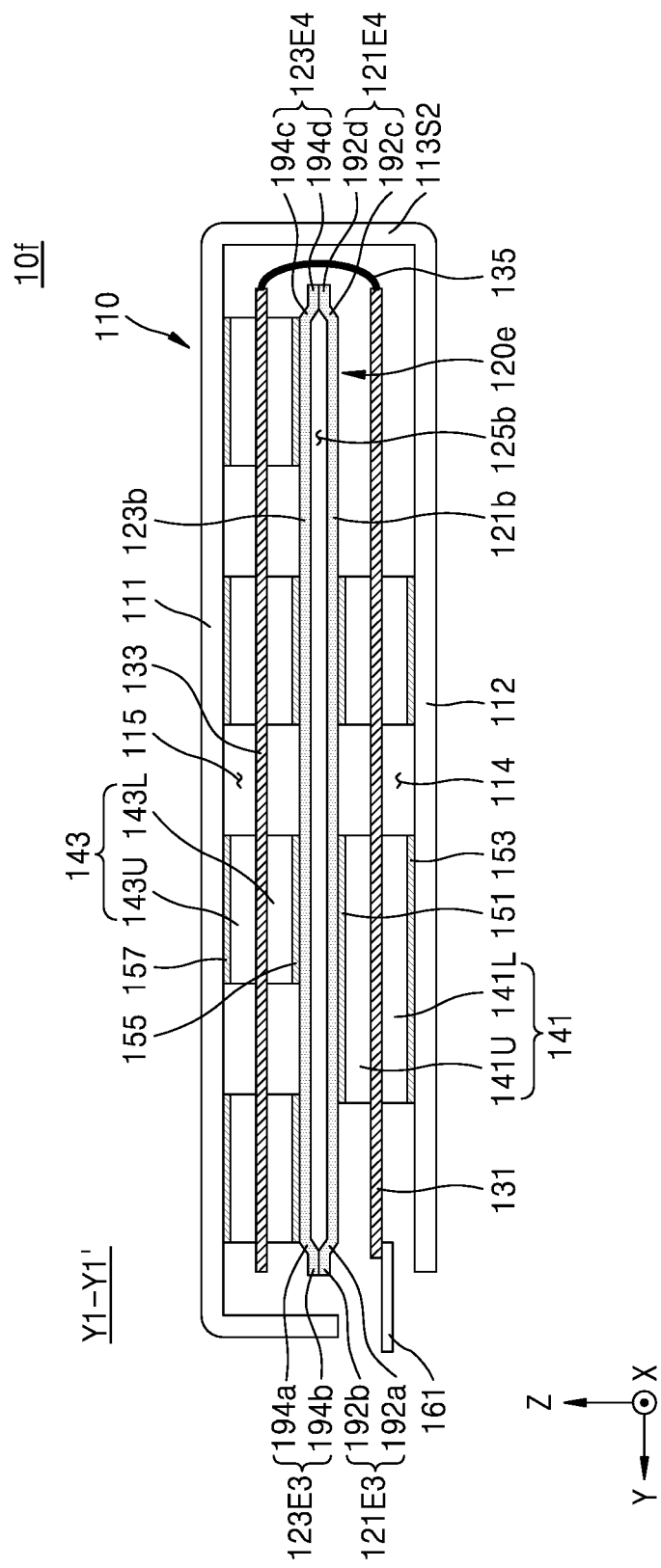
FIG. 16 is a cross-sectional view of the solid state drive apparatus along a line Y1-Y1' of FIG. 14.

FIG. 14 is a perspective view of a solid state drive apparatus 10f according to example embodiments of the inventive concept. FIG. 15 is a cross-sectional view of the solid state drive apparatus 10f along a line X1-X1' of FIG. 14. FIG. 16 is a cross-sectional view of the solid state drive apparatus 10f along a line Y1-Y1' of FIG. 14. Hereinafter, the solid state drive apparatus 10f shown in FIGS. 14 to 16 will be described based on differences from the solid state drive apparatus 10 described above with reference to FIGS. 1 to 5. To the extent that various elements are not described, these elements may be understood to be at least similar to corresponding elements that have been described elsewhere in the instant specification.

Referring to FIGS. 14 to 16, an air passage 125b of a heat dissipation structure 120e may extend from the third sidewall 113S3 of the casing 110 to the fourth sidewall 113S4 in the first direction (X direction) and may be configured to guide an air flow in the first direction (X direction).

The inlet 127i of the air passage 125b may be formed at a first end portion of the heat dissipation structure 120e adjacent to the third sidewall 113S3 of the casing 110, whereas the outlet 127o of the air passage 125b may be formed at a second end portion of the heat dissipation structure 120e adjacent to the fourth sidewall 113S4 of the casing 110. The first end portion and the second end portion of the heat dissipation structure 120e may be exposed through the third sidewall 113S3 and the fourth sidewall 113S4 of the casing 110, respectively, and the external connector 161 may be exposed through the first sidewall 113S1 of the casing 110.

In example embodiments, a lower heat dissipation panel 121b may include a third edge 121E3 adjacent to the first sidewall 113S1 of the casing 110 and a fourth edge 121E4 adjacent to the second sidewall 113S2 of the casing 110, whereas an upper heat dissipation panel 123b may include a third edge 123E3 adjacent to the first sidewall 113S1 of the casing 110 and a fourth edge 123E4 adjacent to the second sidewall 113S2 of the casing 110. The third edge 121E3 of the lower heat dissipation panel 121b may be coupled to the third edge 123E3 of the upper heat dissipation panel 123b, whereas the fourth edge 121E4 of the lower heat dissipation panel 121b may be coupled to the fourth edge 123E4 of the upper heat dissipation panel 123b.

In example embodiments, the third edge 121E3 of the lower heat dissipation panel 121b may include a sloped portion 192a extending outwardly along an upward slope and a third lower adhering portion 192b extending further outward from the sloped portion 192a, whereas the third edge 123E3 of the upper heat dissipation panel 123b may include a sloped portion 194a extending outwardly along a downward slope and a third upper adhering portion 194b extending further outward from the sloped portion 194a. The third upper adhering portion 194b of the third edge 123E3 of the upper heat dissipation panel 123b may be adhered to the third lower adhering portion 192b of the third edge 121E3 of the lower heat dissipation panel 121b. The third edge 123E3 of the upper heat dissipation panel 123b and the third edge 121E3 of the lower heat dissipation panel 121b continuously contact each other in the direction in which the air passage 125b extends, thereby preventing the air inside the air passage 125b from being leaked in a direction toward the first sidewall 113S1 of the casing 110 from the air passage 125b.

In example embodiments, the fourth edge 121E4 of the lower heat dissipation panel 121b may include a sloped portion 192c extending outwardly along an upward slope and a fourth lower adhering portion 192d extending further outward from the sloped portion 192c, whereas the fourth edge 123E4 of the upper heat dissipation panel 123b may include a sloped portion 194c extending outwardly along a downward slope and a fourth upper adhering portion 194d extending further outward from the sloped portion 194c. The fourth upper adhering portion 194d of the fourth edge 123E4 of the upper heat dissipation panel 123b may be adhered to the fourth lower adhering portion 192d of the fourth edge 121E4 of the lower heat dissipation panel 121b. The fourth edge 123E4 of the upper heat dissipation panel 123b and the fourth edge 121E4 of the lower heat dissipation panel 121b continuously contact each other in the direction in which the air passage 125b extends, thereby preventing the air inside the air passage 125b from being leaked in a direction toward the second sidewall 113S2 of the casing 110 from the air passage 125b.

For example, when an air flow in the first direction (X direction) is formed around the solid state drive apparatus 10f by a cooling fan provided outside the casing 110, the air introduced through the inlet 127i of the air passage 125b flows in the first direction (X direction) in which the air passage 125b extends and exits from the air passage 125b through the outlet 127o of the air passage 125b. While the air is flowing in the air passage 125b, heat dissipation regarding the solid state drive apparatus 10f may occur through heat exchange between the heat dissipation structure 120c and the air.

Figure 17:
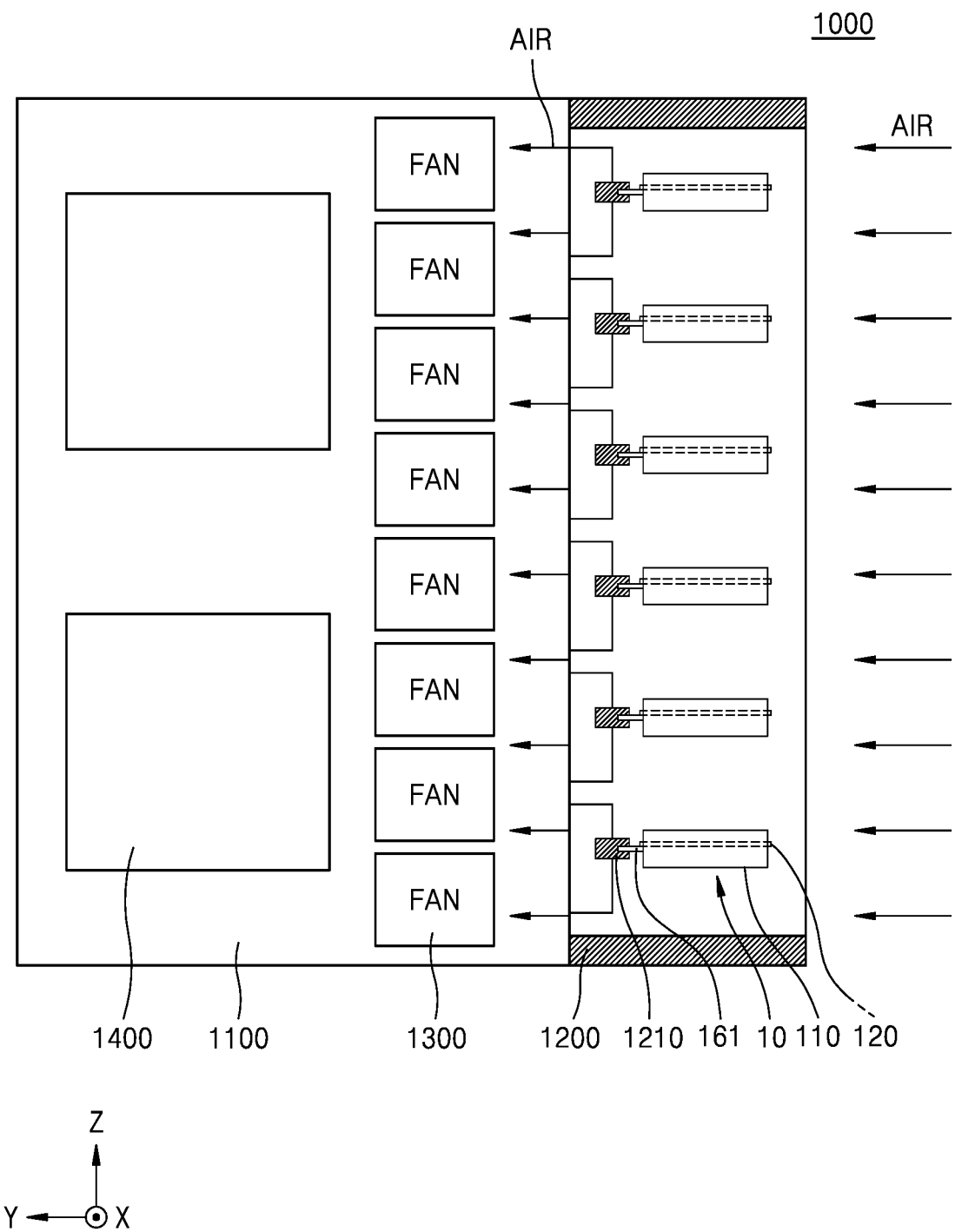
FIG. 17 is a schematic block diagram of a data storage apparatus according to example embodiments of the inventive concept.

FIG. 17 is a schematic block diagram showing a data storage apparatus 1000 according to example embodiments of the inventive concept.

Referring to FIG. 17 together with FIGS. 1 to 5, the data storage apparatus 1000 may be a storage apparatus such as a direct attached storage (DAS), a network attached storage (NAS), or a storage area network (SAN). The data storage apparatus 1000 may include a rack 1200 on which the solid state drive apparatus 10 is mounted and a cooling fan 1300 disposed adjacent to the rack 1200. The rack 1200 and the cooling fan 1300 may be arranged on a supporting substrate 1100 like a PCB. Also, the data storage apparatus 1000 may further include a power supply 1400 for supplying power needed to drive the data storage apparatus 1000 and a processing unit like a CPU for controlling driving of the data storage apparatus 1000.

The rack 1200 may include a plurality of sockets 1210 spaced apart from one another in the third direction (Z direction), and the solid state drive apparatus 10 may be inserted into each of the sockets 1210. For example, the solid state drive apparatus 10 may be slid in the second direction (Y direction) and coupled to a socket 1210 provided inside the rack 1200. When the external connector 161 of the solid state drive apparatus 10 is coupled to the socket 1210, the solid state drive apparatus 10 and the socket 1210 may be physically and electrically connected.

The cooling fan 1300 may provide a forced convection environment inside the data storage apparatus 1000. For example, the cooling fan 1300 may form an air flow flowing in the second direction (Y direction) inside the data storage apparatus 1000. For example, the cooling fan 1300 may be a suction fan. In example embodiments, the solid state drive apparatus 10 may be accommodated inside the rack 1200, such that a direction of the air flow formed by the cooling fan 1300 is parallel to a direction in which the air passage 125 of the heat dissipation structure 120 extends. The air sucked by the cooling fan 1300 may flow in the air passage 125 of the heat dissipation structure 120 and cool the solid state drive apparatus 10.

While the inventive concept has been particularly shown and described with reference to various embodiments thereof, it will be understood that various changes in form and details may be made therein without departing from the spirit and scope of the present disclosure.

What is claimed is:

1. A solid state drive apparatus, comprising:
   a casing comprising a top plate, a bottom plate, a first sidewall including a first opening, and a second sidewall including a second opening;
   a first substrate provided within the casing;
   at least one first semiconductor chip mounted on the first substrate;
   a second substrate provided within the casing;
   at least one second semiconductor chip mounted on the second substrate; and
   a heat dissipation structure disposed between the first substrate and the second substrate, the heat dissipation structure comprising:
      a lower heat dissipation panel contacting the at least one first semiconductor chip;
      an upper heat dissipation panel contacting the at least one second semiconductor chip; and
      an air passage disposed between the lower heat dissipation panel and the upper heat dissipation panel and extending from the first sidewall of the casing to the second sidewall of the casing,
   wherein each of the lower heat dissipation panel and the upper heat dissipation panel includes a first end that protrudes out of the casing from the first opening of the casing and a second end that protrudes out of the casing from the second opening of the casing.

2. The solid state drive apparatus of claim 1, wherein an upper accommodation space defined between the top plate of the casing and the upper heat dissipation panel is isolated from the air passage, and
   a lower accommodation space defined between the bottom plate of the casing and the lower heat dissipation panel is isolated from the air passage.

3. The solid state drive apparatus of claim 1, further comprising a connection substrate connecting between the first substrate and the second substrate and surrounding a side of the heat dissipation structure.

4. The solid state drive apparatus of claim 1, further comprising a thermal interface material disposed between the at least one first semiconductor chip and the lower heat dissipation panel and/or disposed between the at least one second semiconductor chip and the upper heat dissipation panel.

5. The solid state drive apparatus of claim 1, wherein the at least one first semiconductor chip comprises:
   a first upper semiconductor chip disposed between the first substrate and the upper heat dissipation panel; and
   a first lower semiconductor chip disposed between the first substrate and the bottom plate of the casing,
   wherein the at least one second semiconductor chip comprises:
      a second upper semiconductor chip disposed between the second substrate and the top plate of the casing; and
      a second lower semiconductor chip disposed between the second substrate and the lower heat dissipation panel, and
   wherein a thermal interface material is disposed between the first upper semiconductor chip and the upper heat dissipation panel, between the first lower semiconductor chip and the bottom plate of the casing, between the second upper semiconductor chip and the top plate of the casing, and/or between the second lower semiconductor chip and the lower heat dissipation panel.

6. The solid state drive apparatus of claim 1, wherein a height of the air passage ranges from about 3% to about 30% of a height of the casing.

7. The solid state drive apparatus of claim 1, wherein the heat dissipation structure comprises a first end portion exposed through the first sidewall of the casing and a second end portion exposed through the second sidewall of the casing, and
wherein the air passage extends from an outlet formed at the first end portion of the heat dissipation structure to an inlet formed in the second end portion of the heat dissipation structure.

8. The solid state drive apparatus of claim 7, wherein a height of the inlet of the air passage is greater than a height of the outlet of the air passage.

9. The solid state drive apparatus of claim 1, further comprising an external connector connected to the first substrate and exposed through the first sidewall of the casing.

10. The solid state drive apparatus of claim 1, wherein at least one of the lower heat dissipation panel and the upper heat dissipation panel comprises a vent hole connected to the air passage.

11. The solid state drive apparatus of claim 1, wherein the heat dissipation structure further comprises an isolation wall extending between the upper heat dissipation panel and the lower heat dissipation panel, and
wherein the isolation wall extends from a first end portion of the heat dissipation structure exposed through the first sidewall of the casing to a second end portion of the heat dissipation structure exposed through the second sidewall of the casing.

12. The solid state drive apparatus of claim 1, wherein at least one of the lower heat dissipation panel and the upper heat dissipation panel comprises a vapor channel in which a working fluid flows.

13. The solid state drive apparatus of claim 1, further comprising a fan provided within the casing and configured to force an air flow inside the air passage.

14. The solid state drive apparatus of claim 1, further comprising an external connector connected to the first substrate,
wherein each of the external connector and the heat dissipation structure are exposed through the first sidewall of the casing.

15. The solid state drive apparatus of claim 1, further comprising an external connector connected to the first substrate,
wherein the heat dissipation structure is exposed through the first sidewall and the second sidewall of the casing, and
wherein the external connector is exposed through a third sidewall extending between the first sidewall and the second sidewall of the casing.

16. A solid state drive apparatus, comprising:
a casing comprising a top plate, a bottom plate, spaced apart from one another in a vertical direction, a first sidewall, and a second sidewall, spaced apart from one another in a horizontal direction;
a first substrate disposed within a first accommodation space of the casing;
at least one first semiconductor chip mounted on the first substrate;
a second substrate disposed within a second accommodation space of the casing;
at least one second semiconductor chip mounted on the second substrate; and
a heat dissipation structure disposed between the first substrate and the second substrate and extending in the horizontal direction, the heat dissipation structure comprising:
a first end portion exposed through a first opening of the first sidewall of the casing;
a second end portion, spaced apart from the first end portion in the horizontal direction and exposed through a second opening of the second sidewall of the casing; and
an air passage extending in the horizontal direction from the first end portion to the second end portion,
wherein the air passage is isolated from the first accommodation space and the second accommodation space,
wherein the first accommodation space communicates with the second accommodation space, and
wherein a longest vertical length of the first end portion of the heat dissipation structure is less than a vertical length of the first opening.

17. The solid state drive apparatus of claim 16, wherein the heat dissipation structure further comprises:
a lower heat dissipation panel contacting the at least one first semiconductor chip; and
an upper heat dissipation panel contacting the at least one second semiconductor chip,
wherein the air passage is defined between the lower heat dissipation panel and the upper heat dissipation panel.

18. The solid state drive apparatus of claim 17, further comprising:
a first thermal interface material disposed between the at least one first semiconductor chip and the lower heat dissipation panel; and
a second thermal interface material disposed between the at least one second semiconductor chip and the upper heat dissipation panel.

19. The solid state drive apparatus of claim 16, wherein the first end portion of the heat dissipation structure protrudes from the first sidewall of the casing,
wherein the second end portion of the heat dissipation structure protrudes from the second sidewall of the casing,
wherein the air passage extends from an outlet disposed at the first end portion of the heat dissipation structure to an inlet disposed at the second end portion of the heat dissipation structure, and
wherein an area of the inlet of the air passage is larger than an area of the outlet of the air passage.

20. A data storage apparatus, comprising:
a rack comprising a socket;
a solid state drive apparatus mounted on the rack; and
a cooling fan disposed adjacent to the rack and configured to force an air flow,
wherein the solid state drive apparatus comprises:
a casing comprising a top plate, a bottom plate, a first sidewall including a first opening, and a second sidewall including a second opening;
a first substrate disposed within the casing;
an external connector connected to the first substrate and inserted into the socket;
at least one first semiconductor chip mounted on the first substrate;
a second substrate disposed within the casing;
at least one second semiconductor chip mounted on the second substrate; and
a heat dissipation structure comprising:
a lower heat dissipation panel contacting the at least one first semiconductor chip;

an upper heat dissipation panel contacting the at least one second semiconductor chip; and an air passage disposed between the lower heat dissipation panel and the upper heat dissipation panel and extending from the first sidewall of the casing to the second sidewall of the casing, wherein each of the lower heat dissipation panel and the upper heat dissipation panel includes a first end that protrudes out of the casing from the first opening of the casing and a second end that protrudes out of the casing from the second opening of the casing.

\* \* \* \* \*